(12) United States Patent
Oikawa

(10) Patent No.: US 9,209,794 B2
(45) Date of Patent: Dec. 8, 2015

(54) MAGNETIC ELEMENT CONTROL DEVICE, MAGNETIC ELEMENT CONTROL METHOD AND MAGNETIC DETECTION DEVICE

(71) Applicant: FUJIKURA LTD., Tokyo (JP)

(72) Inventor: Yasushi Oikawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/559,245

(22) Filed: Dec. 3, 2014

(65) Prior Publication Data

US 2015/0085419 A1   Mar. 26, 2015

Related U.S. Application Data

(63) Continuation of application No. PCT/JP2013/065869, filed on Jun. 7, 2013.

(30) Foreign Application Priority Data

Jun. 8, 2012   (JP) ................. 2012-130859

(51) Int. Cl.
| | |
|---|---|
| H01H 47/00 | (2006.01) |
| H01H 47/32 | (2006.01) |
| H03K 17/14 | (2006.01) |
| G01R 33/00 | (2006.01) |
| G01R 33/04 | (2006.01) |
| H03K 17/82 | (2006.01) |

(52) U.S. Cl.
CPC ............ *H03K 17/14* (2013.01); *G01R 33/0041* (2013.01); *G01R 33/04* (2013.01); *H03K 17/82* (2013.01)

(58) Field of Classification Search
USPC ........................................................ 361/159
See application file for complete search history.

(56) References Cited

U.S. PATENT DOCUMENTS

| | | | | |
|---|---|---|---|---|
| 4,300,095 | A | * | 11/1981 | Rhodes .......................... 324/255 |
| 2007/0170916 | A1 | | 7/2007 | Beranger |

(Continued)

FOREIGN PATENT DOCUMENTS

| | | |
|---|---|---|
| CN | 101228453 A | 7/2008 |
| CN | 101995559 A | 3/2011 |
| JP | 50-99579 A | 8/1975 |

(Continued)

OTHER PUBLICATIONS

JP-2007-163424; Entire Specification.*
JP-2007-199069; Entire Specification.*
Communication dated Mar. 12, 2013, issued by the Japan Patent Office in corresponding Japanese Application No. 2012-130860.

(Continued)

*Primary Examiner* — Dharti Patel
(74) *Attorney, Agent, or Firm* — Sughrue Mion, PLLC

(57) ABSTRACT

A magnetic element control device of the present invention includes an excitation signal generation unit that generates an alternating signal, an excitation signal adjustment unit that generates an alternating voltage signal from the alternating signal, and generates an excitation signal which is applied to an exciting coil on the basis of the alternating voltage signal, a detection signal comparison unit that detects a detection signal of a positive voltage or a negative voltage which is generated by an induced electromotive force when a current direction of the excitation signal switches, and a feedback signal adjustment unit that generates a feedback signal for applying a magnetic field, cancelling a stationary magnetic field which is applied to a magnetic element from voltage information, to a feedback coil.

7 Claims, 16 Drawing Sheets

(56) References Cited

U.S. PATENT DOCUMENTS

2009/0230955 A1 9/2009 Kejik et al.
2011/0241665 A1 10/2011 Takatsuji

FOREIGN PATENT DOCUMENTS

| JP | 58-180964 A | 10/1983 |
| JP | 4-157323 A | 5/1992 |
| JP | 8-122422 A | 5/1996 |
| JP | 2005-083868 A | 3/2005 |
| JP | 2007-78422 A | 3/2007 |
| JP | 2007-78423 A | 3/2007 |
| JP | 2007-163424 A | 6/2007 |
| JP | 2007-199069 A | 8/2007 |
| JP | 2008-292325 A | 12/2008 |

OTHER PUBLICATIONS

Communication dated Apr. 2, 2013, issued by the Japan Patent Office in corresponding Japanese Application No. 2012-130859.
Communication dated Aug. 13, 2013, issued by the Japan Patent Office in corresponding Japanese Application No. 2012-130860.
Communication dated May 28, 2015, issued by the State Intellectual Property Office of the People's Republic of China in corresponding Chinese Application No. 201380029134.X.
International Search Report for PCT/JP2013/065869 dated Sep. 17, 2013.
International Search Report for PCT/JP2013/065873 dated Sep. 10, 2013.
Notice of Allowance for JP 2012-130859 dated Sep. 17, 2013.

* cited by examiner

MAGNETIC ELEMENT CONTROL DEVICE, MAGNETIC ELEMENT CONTROL METHOD AND MAGNETIC DETECTION DEVICE

CROSS REFERENCE TO RELATED APPLICATIONS

This application is a continuation application based on a PCT Patent Application No. PCT/JP2013/065869, filed Jun. 7, 2013, whose priority is claimed on Japanese Patent Application No. 2012-130859 filed Jun. 8, 2012, the entire contents of which are hereby incorporated by reference.

BACKGROUND OF THE INVENTION

1. Field of the Invention

The present invention relates to a signal processing circuit and a physical quantity measuring device using the signal processing circuit, and particularly relates to a magnetic element control device that drives a time-resolution flux-gate type (hereinafter, referred to as an FG-type) magnetic element, a magnetic element control method, and a magnetic detection device that detects a magnetic field using the magnetic element control method.

2. Description of the Related Art

Generally, FG-type magnetic elements have a high sensitivity of detecting a magnetic field and are capable of a reduction in size, as compared to Hall elements or magneto-resistive elements which are magnetic elements that detect similar magnetism, and thus are used in azimuth detection devices such as portable electronic devices, and the like.

FIG. 12 is a diagram showing a configuration example of a time-resolution FG-type magnetic element (for magnetic balance type measurement). As shown in FIG. 12, the FG-type magnetic element in the magnetic balance type measurement is configured such that a feedback (hereinafter, referred to as FB) winding coil is wound around the outer circumferential surface of a magnetic substance core which is formed of a high magnetic permeability material, in addition to an excitation winding and a detection winding. A region around which the excitation winding is wound is driven by an excitation signal as an exciting coil, a region around which the detection winding is wound outputs a detection signal as a detection coil, and a region around which a feedback winding is wound is driven by a feedback signal as a feedback coil.

FIG. 13 is a waveform diagram showing a principle of a magnetic balance type measurement in which magnetism is detected using the time-resolution FG-type magnetic element.

PART (a) of FIG. 13 shows an excitation current which is supplied to the exciting coil of the magnetic element, in which the vertical axis thereof represents a current value of the excitation current, and the horizontal axis thereof represents time. The excitation current is a positive and negative alternating signal bordered by a reference current value of 0 A (zero amperes). PART (b) of FIG. 13 shows an FB signal (that is, a feedback signal) which is a current applied to the FB coil of the magnetic element, in which the vertical axis thereof represents a current value of the FB signal, and the horizontal axis thereof represents time. PART (c) of FIG. 13 shows the voltage value of a pulse (hereinafter, also called a pickup signal pu) which is generated by the detection coil of the magnetic element due to an induced electromotive force, in which the horizontal axis thereof represents time.

As shown in FIG. 13, in the case of magnetic balance type measurement, a magnetic field that cancels out the stationary magnetic field (stationary magnetic field passing through the magnetic substance core) which is applied to the magnetic element is generated by the above FB coil A stationary magnetic field which is applied to the magnetic element is measured from a current value when the magnetic field that cancels out a stationary magnetic field is generated in the FB coil.

In a magnetic balance system, as a coil that generates a magnetic field that cancels out a stationary magnetic field in the magnetic substance core, the above FB coil is provided in the magnetic element, in addition to the exciting coil and the detection coil.

Hereinafter, in this specification, a method in which a stationary magnetic field in the magnetic substance core is canceled by applying an FB signal and in which a magnetic field is measured is referred to as FB control of an FB coil.

In addition, in the case of the magnetic balance type measurement, a time interval between pulses generated by the detection coil is measured in the positive and negative alternating time zone of the excitation signal which is applied to the exciting coil. The FB signal is applied to the FB coil so that time from time t1 at which the measured detection signal of a negative voltage is output to time t2 at which the detection signal of a positive voltage is detected becomes equal to T/2.

For example, in PART (c) of FIG. 13, when a time width between time t1 and time t2 is larger than T/2, the stationary magnetic field in a negative direction is applied as shown in PART (a) of FIG. 13, and the curve of the excitation signal changes substantially from curve L0 to curve L2. For this reason, since curve L2 of the excitation signal is returned to a position of curve L0 in which the time width between time t1 and time t2 becomes equal to T/2, the FB signal of the current value of line FB2 in PART (b) of FIG. 13 is applied to the FB coil.

On the other hand, in PART (c) of FIG. 13, when the time width between time t1 and time t2 is smaller than T/2, the stationary magnetic field in a positive direction is applied as shown in PART (a) of FIG. 13, and the curve of the excitation signal changes substantially from curve L0 to curve L1. For this reason, since curve L1 of the excitation signal is returned to the position of curve L0, the FB signal of the current value of line FB1 in PART (b) of FIG. 13 is applied to the FB coil.

The intensity of the stationary magnetic field which is applied to the magnetic element is obtained from the current value of the FB signal applied to the FB coil so that the time width between time t1 and time t2 becomes equal to T/2.

Meanwhile, the above-mentioned description has been given of a case where the vertical axis component in PART (a) of FIG. 13 is set to a current and the excitation signal which is applied to the exciting coil is a current signal, but the vertical axis component may be represented as a voltage value between both ends of the terminal of the exciting coil. In this case, in the PART (a) of FIG. 13, the voltage of the vertical axis intersecting the horizontal axis is set to a reference voltage and is represented by Vref (which is 0 A in current notation).

Next, FIG. 14 is a block diagram showing an example configuration of a magnetic detection device using a magnetic element control device in FB coil FB control. In FIG. 14, a magnetic element 100 is constituted by a detection coil 1001, an exciting coil 1002, and an FB coil 1003.

A magnetic element control device 200 is constituted by a magnetic element control unit 201, a clock signal generation unit 202, and a clock signal adjustment unit 203.

The clock signal generation unit 202 generates a clock of cycle T, and outputs the generated clock to the clock signal adjustment unit 203.

The clock signal adjustment unit 203 adjusts the signal level of the clock to be supplied, and outputs the adjusted clock to the magnetic element control unit 201.

The magnetic element control unit 201 includes a detection signal amplification unit 2011, a detection signal comparison unit 2012, a feedback signal adjustment unit 2013, a feedback signal conversion unit 2014, a data signal conversion unit 2015, an excitation signal adjustment unit 2016, and an excitation signal generation unit 2017.

The excitation signal generation unit 2017 generates a triangular wave as the excitation signal shown in PART (a) of FIG. 13 from a clock which is supplied from the clock signal adjustment unit 203.

The excitation signal adjustment unit 2016 adjusts the voltage level of the excitation signal which is supplied from the excitation signal generation unit 2017, and supplies the adjusted voltage level, as the excitation signal, to the exciting coil.

The exciting coil 1002 generates a magnetic field corresponding to the triangular wave within the magnetic substance core of the magnetic element 100.

The detection coil 1001 generates a pulse at the positive and negative alternating time zone of the excitation signal in the magnetic substance core.

The detection signal amplification unit 2011 amplifies the voltage level of the pulse which is supplied from the detection coil, and outputs the amplified voltage level, as the detection signal, to the detection signal comparison unit 2012.

The detection signal comparison unit 2012 obtains a difference between T/2 and the time width of the pulse (detection signal) between time t1 and time t2, and outputs the difference to the feedback signal conversion unit 2014.

The feedback signal conversion unit 2014 obtains the current value of the FB signal, supplied to the FB coil, from the supplied difference.

Here, the feedback signal conversion unit 2014 reads out the current value corresponding to the difference from an FB current value table which is previously written and stored in an internal storage unit, and obtains the current value of the FB signal.

The FB current value table is a table indicating the correspondence of the above difference to a current value (digital value) for cancel a stationary magnetic field in the magnetic substance core.

The feedback signal adjustment unit 2013 performs D/A (Digital/Analog) conversion on the current value of the FB signal which is supplied from the feedback signal conversion unit 2014, and outputs the generated current as the FB signal to the FB coil 1003. In addition, the feedback signal adjustment unit 2013 outputs the current value of the FB signal, supplied from the feedback signal conversion unit 2014, to the data signal conversion unit 2015.

The data signal conversion unit 2015 obtains the intensity of the stationary magnetic field canceled in the magnetic substance core, that is, the intensity of the stationary magnetic field applied to the magnetic element 100, from the current value of the FB signal to be supplied. Here, the data signal conversion unit 2015 reads out the magnetic field intensity corresponding to the current value of the FB signal, from a current value magnetic field table which is previously written and stored in an internal storage unit, and obtains the intensity of the magnetic field which is applied to the magnetic element 100. The current value magnetic field table is a table indicating the correspondence of the above current value of the FB signal to the intensity of the applied stationary magnetic field.

When a magnetic field in the magnetic balance system is detected using the time-resolution FG-type magnetic element, a magnetic field within the magnetic substance core is maintained in an equilibrium state so that the detection signal is output at a constant time interval (T/2) regardless of the stationary magnetic field which is applied to the magnetic element 100. For this reason, a restriction can be performed by the power supply voltage of the entire magnetic element 100, that is, the measurement of the magnetic field can be performed in a range in which the current value of the FB signal is capable of being supplied.

In addition, when the magnetic of the magnetic balance system is detected using the time-resolution FG-type magnetic element, the magnetic field dependency of excitation efficiency is small as the characteristics of the magnetic element, and thus the waveform of the detection signal and the stationarity of a time interval at which the detection signal is generated have a tendency to be maintained.

For this reason, when a measuring object is applied to the magnetic element that measures a magnetic field which is generated by a current of approximately several hundred A (amperes) in the entire measurement current range in a state where linearity is maintained, magnetic field detection in the magnetic balance system is mainly used (see, for example, Japanese Unexamined Patent Applications, First Publications No. 2008-292325, No. 2007-078423, and No. 2007-078422).

When the magnetic field is detected by the magnetic balance system using the time-resolution FG-type magnetic element described above, the FB signal is generally performed by current control in FB control of an FB coil.

As previously stated, even when there is a proportional relation between the current value in an FB control signal and the intensity of a magnetic field generated by the current value, and the resistance of the FB coil (hereinafter, also referred to as a feedback coil) changes corresponding to a temperature due to the difference in the current value of the FB signal, the current value of the FB signal is controlled at a constant current. For this reason, in the magnetic field having a high intensity in which the current value of the FB signal increases, it is also possible to maintain the sensitivity linearity of the magnetic element.

In addition, even when each excitation efficiency of the exciting coil and the feedback coil changes with the individual deviation of the characteristics of the magnetic element, the convergence state of magnetic field equilibrium between the magnetic field generated by the FB signal and the stationary magnetic field is restricted by the characteristics of the control circuit that outputs the FB signal, and a residual error (error) in convergence is not generated.

Further, when the ratio of the excitation efficiency of the exciting coil to the excitation efficiency of the feedback coil is held constant, the magnetic sensitivity ratio of the exciting coil to the feedback coil does not change, and thus the convergence time until the magnetic field based on the FB signal and the stationary magnetic field reach magnetic field equilibrium also does not change.

Therefore, when the exciting coil and the feedback coil in the magnetic element are simultaneously formed by a semiconductor process or the like, a coil resistance ratio is maintained even in a case where each resistance of the exciting coil and the feedback coil changes. Thus, a residual error in an equilibrium state which is an index of the convergence of magnetic field equilibrium does not occur, and the time to reach the equilibrium state does not change.

However, when a magnetic field is detected by the magnetic balance type using the time-resolution FG type magnetic element, and the FB signal controls the intensity of a magnetic field generated by the feedback coil based on a current value, the current value corresponding to the intensity of a magnetic field is required to be determined by controlling constant current. For this reason, a voltage-to-current conversion circuit that controls a constant current has to be mounted.

FIG. 15 is a diagram showing a configuration of a voltage-to-current conversion circuit. In addition, FIG. 16 is a diagram showing the voltage-to-current conversion circuit.

As shown in FIG. 15, the voltage-to-current conversion circuit includes an excitation triangular wave generation circuit 2017a constituting the above-mentioned excitation signal generation unit 2017, and the excitation signal adjustment unit 2016.

The excitation triangular wave generation circuit 2017a generates a triangular wave (having a voltage level Vex), as the excitation signal shown in FIG. 16, from a clock which is supplied from the clock signal adjustment unit 203.

The excitation signal adjustment unit 2016 includes a difference amplifier 2001 and a resistor 2002 (resistance value R).

The excitation signal adjustment unit 2016 converts the triangular wave Vex, and generates a constant current (current value Iex) flowing through the exciting coil 1002 (resistance value Rex).

In the resistor 2002, the first end thereof is connected to the output of the excitation triangular wave generation circuit 2017a, and the second end thereof is connected to the inverting input terminal of the difference amplifier 2001.

The difference amplifier 2001 is configured such that the non-inverting input terminal thereof is connected to a reference voltage source which is not shown and a reference voltage Vref is input thereto, and that the inverting input terminal thereof is connected to the second end of the resistor 2002.

The exciting coil 1002 is connected between the output terminal and the inverting input terminal of the difference amplifier 2001.

According to the above configuration, in a current-voltage conversion circuit, when the voltage level (which is set to V−) of the non-inverting input terminal and the voltage level Vex of the triangular wave change, an current Iex is caused to flow to the exciting coil 1002 so that the relation of V−=Vref is established. That is, in a range where the peak value of an exciting voltage (voltage between both ends of the exciting coil 1002) is Iex×Rex<Vcc/2 when the power supply voltage level of the difference amplifier 2001 is set to Vcc, the relation of Iex=(Vex−Vref)/R is established. Thereby, since voltage control is performed on Vex, the excitation signal for current control is generated.

Incidentally, as described above, when the triangular wave is used in the excitation signal, signal distortion (hereinafter, called crossover distortion) shown in FIG. 16 is generated by an amplifier used in the excitation triangular wave generation circuit 2017a. Hereinafter, the generation of the signal distortion will be described.

In FIG. 16, the excitation signal shows the waveform of a current flowing through the exciting coil 1002, and shows a state where the crossover distortion is generated in the excitation signal at a time of switching from positive to negative and a time of switching from negative to positive.

The crossover distortion occurs because crossover distortion generated in the triangular wave voltage Vex which is generated by the excitation triangular wave generation circuit 2017a is reflected. Consequently, there is considered a method of suppressing distortion described below through the amplifier used in the excitation triangular wave generation circuit 2017a.

For example, when the amplifier used in the excitation triangular wave generation circuit 2017a is a class A amplifier, there is considered a method of applying a bias current not to generate the crossover distortion in the triangular wave which is an output signal, so that the crossover distortion does not occur in the vicinity of a reference current value of 0 A of the excitation current. However, in such a method, it is necessary to cause a bias current to flow steadily, and thus the power consumption of the entire device increases.

On the other hand, when the amplifier used in the excitation triangular wave generation circuit 2017a is a class B amplifier, since the amplifier is an amplifier of a type in which a bias current is not applied, crossover distortion occurs in the triangular wave which is an output signal, it is not possible to avoid the occurrence of the crossover distortion in the vicinity of a reference current value of 0 A of the excitation current.

Generally, as the amplifier used in the excitation triangular wave generation circuit 2017a, an amplifier called a class AB amplifier that performs an intermediate operation between class A and class B mentioned above is used. For this reason, when a current-voltage conversion circuit is formed using a class AB amplifier having a small drive current for the purpose of a reduction in power consumption, the crossover distortion occurs in the vicinity of a reference current value of 0 A of the excitation current.

As described above, the detection signal comparison unit 2012 obtains a time width between a time at which the pulse (pu signal) switches from positive to negative and a time at which the pulse switches from negative to positive, that is, a difference between T/2 and a time width from a first detection signal shown in FIG. 16 from a second detection signal, and outputs the resultant to the feedback signal conversion unit 2014. In addition, the feedback signal conversion unit 2014 obtains the current value of the FB signal which is supplied to the feedback coil, from the supplied difference.

In FIG. 16, when a stationary magnetic field is not applied to the magnetic element 100, the current value which is supplied to the exciting coil 1002 shows a change corresponding to curve L0c. In addition, when the time width of the pu signal is larger than T/2, a stationary magnetic field in a negative direction is applied, and the curve of the excitation signal substantially changes from curve L0c to curve L2c. In addition, when the time width of the pu signal becomes smaller than T/2, a stationary magnetic field in a positive direction is applied, and the curve of the excitation signal substantially changes from curve L0c to curve L1c.

Among these curves, curve L0c transects 0 A which is a reference current value at a time zone when the crossover distortion is generated in the excitation signal. For this reason, the pu signal is generated in a period when linearity is not present in the excitation current. That is, a period T/2 when the detection signal comparison unit 2012 is used in a difference arithmetic operation includes a region in which the crossover distortion is generated in the excitation signal, and thus is set to a value in which the detection accuracy of a stationary magnetic field is reduced.

As stated above, in the magnetic element control device 200 shown in FIG. 15, since the pu signal is generated at a time when the crossover distortion is generated, the linearity of magnetic sensitivity deteriorates, and output stability at a constant temperature and in a constant external magnetic field deteriorates.

The present invention is contrived in view of such circumstances, and an object thereof is that, in a magnetic element control device that detects a magnetic field of a magnetic balance system using a time-resolution FG type magnetic element, the output stability of the magnetic element control device is improved without being influenced by signal distortion which is generated in an excitation signal or a feedback signal.

SUMMARY OF THE INVENTION

According to a first aspect of the present invention, there is provided a magnetic element control device that controls a flux-gate type magnetic element including an exciting coil, a detection coil, and a feedback coil when an intensity of a stationary magnetic field which is applied to the magnetic element is detected using a time-resolution magnetic balance system, including: an excitation signal generation unit that generates an alternating signal; an excitation signal adjustment unit that generates an alternating voltage signal from the alternating signal, and generates an excitation signal which is applied to the exciting coil on the basis of the alternating voltage signal; a detection signal comparison unit that detects a detection signal of a positive voltage or a negative voltage which is generated by an induced electromotive force when a current direction of the excitation signal switches; a feedback signal generation unit that converts a time width between detection signals of the positive voltage and the negative voltage into voltage information; a feedback signal adjustment unit that generates a feedback signal that applies a magnetic field, cancelling out the stationary magnetic field which is applied to the magnetic element from the voltage information, to the feedback coil; a data signal conversion unit that outputs the feedback signal as a data signal indicating a magnetic field intensity; and an adjustment signal generation unit that outputs a direct current adjustment signal, adjusted in advance, which is superimposed with respect to at least one of the excitation signal or the feedback signal, wherein the excitation signal adjustment unit or the feedback signal adjustment unit generates the excitation signal or the feedback signal on the basis of the direct current adjustment signal to apply the generated signal to the exciting coil or the feedback coil, and generates the detection signal detected by the detection signal comparison unit so as to be deviated with respect to a non-linear region of the excitation signal.

According to a second aspect of the present invention, in the magnetic element control device of the first aspect, the adjustment signal generation unit includes a first resistor of which one end is connected to an input terminal capable of inputting an adjustment voltage, the excitation signal adjustment unit or the feedback signal adjustment unit includes a second resistor of which one end is connected to the excitation signal generation unit and the feedback signal generation unit, and a difference amplifier in which the first resistor and the second resistor are connected to an inverting input terminal, and a non-inverting input terminal is connected to a reference voltage which is set in advance, the exciting coil or the feedback coil is connected between an output terminal and the inverting input terminal of the difference amplifier, and the difference amplifier is configured to cause a current to flow to the exciting coil or the feedback coil so that a voltage level of the inverting input terminal and a voltage level of the non-inverting input terminal are equal to each other.

According to a third aspect of the present invention, in the magnetic element control device of the first or second aspect, a temperature sensor that measures the temperature of the magnetic element is further included, and the adjustment signal generation unit performs correction by multiplying the direct current adjustment signal by a coefficient corresponding to the temperature, and supplies the direct current adjustment signal after the correction to the excitation signal adjustment unit or the feedback signal adjustment unit.

According to a fourth aspect of the present invention, in the magnetic element control device of the first to third aspects, the feedback signal generation unit obtains a duty ratio indicating a voltage value of the feedback signal, as the voltage information, from the time width, and outputs a square wave of the duty ratio indicating the voltage value of the feedback signal to the feedback signal adjustment unit, and the feedback signal adjustment unit generates the feedback signal which is a direct-current voltage obtained by associating the square wave with the duty ratio.

According to a fifth aspect of the present invention, in the magnetic element control device of the first to third aspects, the feedback signal generation unit obtains a difference between the time width and a reference time width which is set in advance, obtains a digital value indicating the voltage value of the feedback signal, as the voltage information, from the difference, and outputs the digital value to the feedback signal adjustment unit, and the feedback signal adjustment unit generates a feedback signal which is a direct-current voltage indicated by the digital value.

According to a sixth aspect of the present invention, in the magnetic element control device of the first to fifth aspects, a clock signal generation unit that generates a periodic clock signal and an excitation signal generation unit that generates a triangular wave signal as the alternating signal synchronized with the clock signal are further included.

According to a seventh aspect of the present invention, there is provided a magnetic element control method of controlling a flux-gate type magnetic element having an exciting coil, a detection coil, and a feedback coil when an intensity of a stationary magnetic field which is applied to the magnetic element is detected using a time-resolution magnetic balance system, including: an excitation signal generation process of generating an alternating signal; an excitation signal adjustment process of generating an alternating voltage signal from the alternating signal, and generating an excitation signal which is applied to the exciting coil on the basis of the alternating voltage signal; a detection signal comparison process of detecting a detection signal of a positive voltage or a negative voltage which is generated by an induced electromotive force when a current direction of the excitation signal switches; a feedback signal generation process of converting a time width between detection signals of the positive voltage and the negative voltage into voltage information; a feedback signal adjustment process of applying a magnetic field, cancelling a stationary magnetic field which is applied to the magnetic element from the voltage information, to the feedback coil; a data signal conversion process of outputting the feedback signal as a data signal indicating a magnetic field intensity; and an adjustment signal process of outputting a direct current adjustment signal, adjusted in advance, which is superimposed with respect to at least one of the excitation signal or the feedback signal, wherein the excitation signal adjustment process or the feedback signal adjustment process includes a process of generates the excitation signal or the feedback signal on the basis of the direct current adjustment signal to apply the generated signal to the exciting coil or the feedback coil, and generating the detection signal detected in the detection signal comparison process so as to be deviated with respect to a non-linear region of the excitation signal.

According to an eighth aspect of the present invention, there is provided a magnetic field detection device which is based on a magnetic balance system that detects an intensity of a stationary magnetic field to be applied, including: a flux-gate type magnetic element having an exciting coil, a detection coil, and a feedback coil; an excitation signal generation unit that generates an alternating signal; An excitation signal adjustment unit that generates an alternating voltage signal from the alternating signal, and generates an excitation signal which is applied to the exciting coil on the basis of the alternating voltage signal; a detection signal comparison unit that detects a detection signal of a positive voltage or a negative voltage which is generated by an induced electromotive force when a current direction of the excitation signal switches; a feedback signal generation unit that converts a time width between detection signals of the positive voltage and the negative voltage into voltage information; a feedback signal adjustment unit that generates a feedback signal that applies a magnetic field, cancelling out the stationary magnetic field which is applied to the magnetic element from the voltage information, to the feedback coil; a data signal conversion unit that outputs the feedback signal as a data signal indicating a magnetic field intensity; and an adjustment signal generation unit that outputs a direct current adjustment signal, adjusted in advance, which is superimposed with respect to at least one of the excitation signal or the feedback signal, wherein the excitation signal adjustment unit or the feedback signal adjustment unit generates the excitation signal or the feedback signal on the basis of the direct current adjustment signal to apply the generated signal to the exciting coil or the feedback coil, and generates the detection signal detected by the detection signal comparison unit so as to be deviated with respect to a non-linear region in the current direction of the excitation signal.

According to the above-described aspects of the present invention, the adjustment signal generation unit that outputs a direct current adjustment signal, adjusted in advance, which is superimposed with respect to at least one of the excitation signal or the feedback signal is included, and the excitation signal adjustment unit or the feedback signal adjustment unit generates the excitation signal or the feedback signal on the basis of the direct current adjustment signal to apply the generated signal to the exciting coil or the feedback coil. For this reason, since the detection signal detected by the detection signal comparison unit can be generated so as to be deviated with respect to a non-linear region (region in which crossover distortion is generated) of the excitation signal, it is possible to measure a stationary magnetic field while maintaining linearity from a measurement lower limit to a measurement upper limit.

Therefore, according to the aspects of the present invention, in the magnetic element control device that detects a magnetic field of a magnetic balance type using a time-resolution FG type magnetic element, it is possible to improve the output stability of the device without being influenced by signal distortion which is generated in the excitation signal or the feedback signal.

DETAILED DESCRIPTION OF THE PREFERRED EMBODIMENTS

First Embodiment

A principle of the present invention and a magnetic element control device 110 according to a first embodiment of the present invention will be described with reference to FIGS. 1 to 3.

Figure 1:
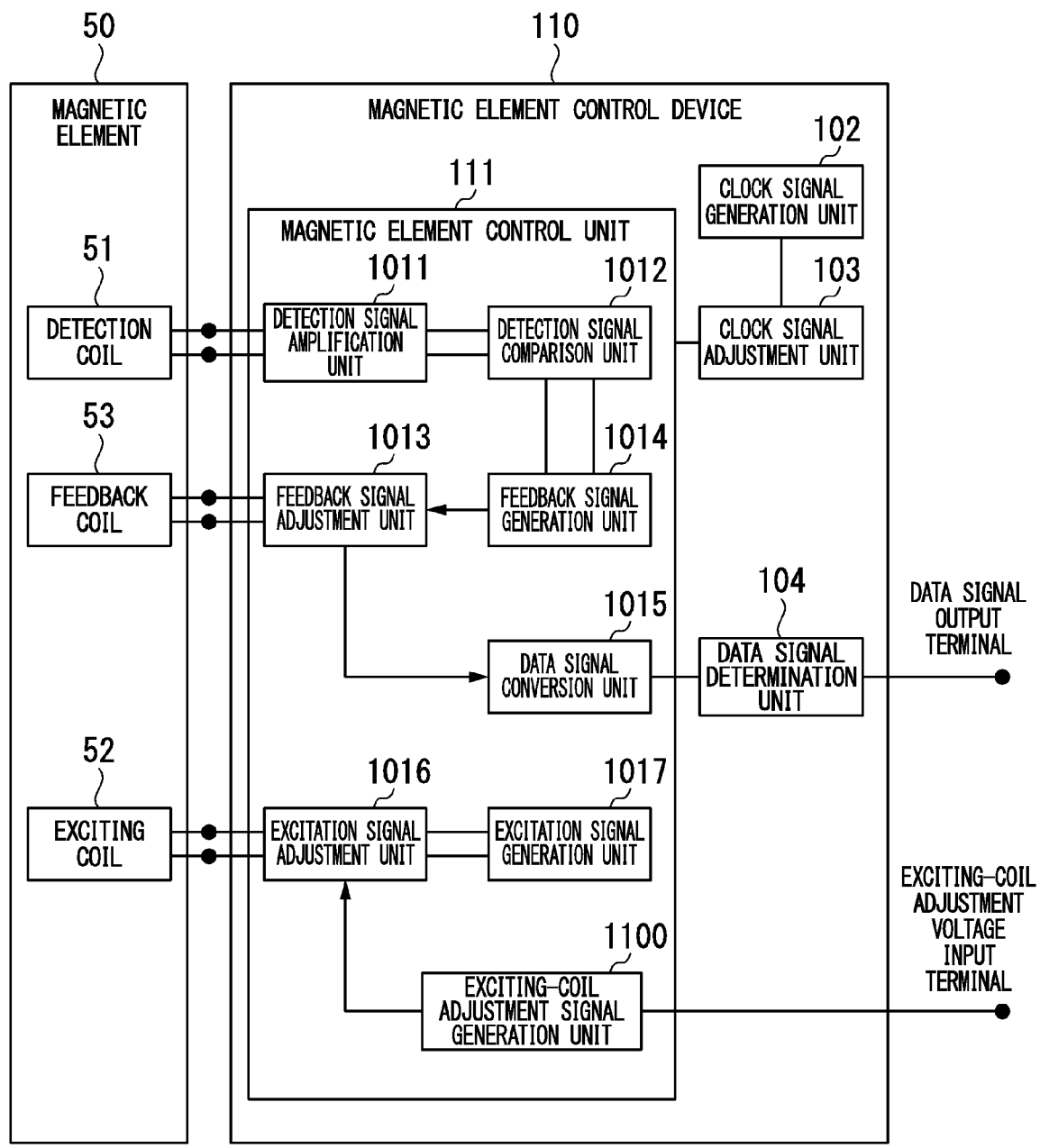
FIG. 1 is a diagram showing a configuration example of a magnetic element control device 110 according to a first embodiment.

FIG. 1 is a diagram showing a configuration example of the magnetic element control device 110 according to the present embodiment. FIG. 2 is a diagram showing of a configuration example of a compensation circuit in the magnetic element control device 110.

Figure 12:
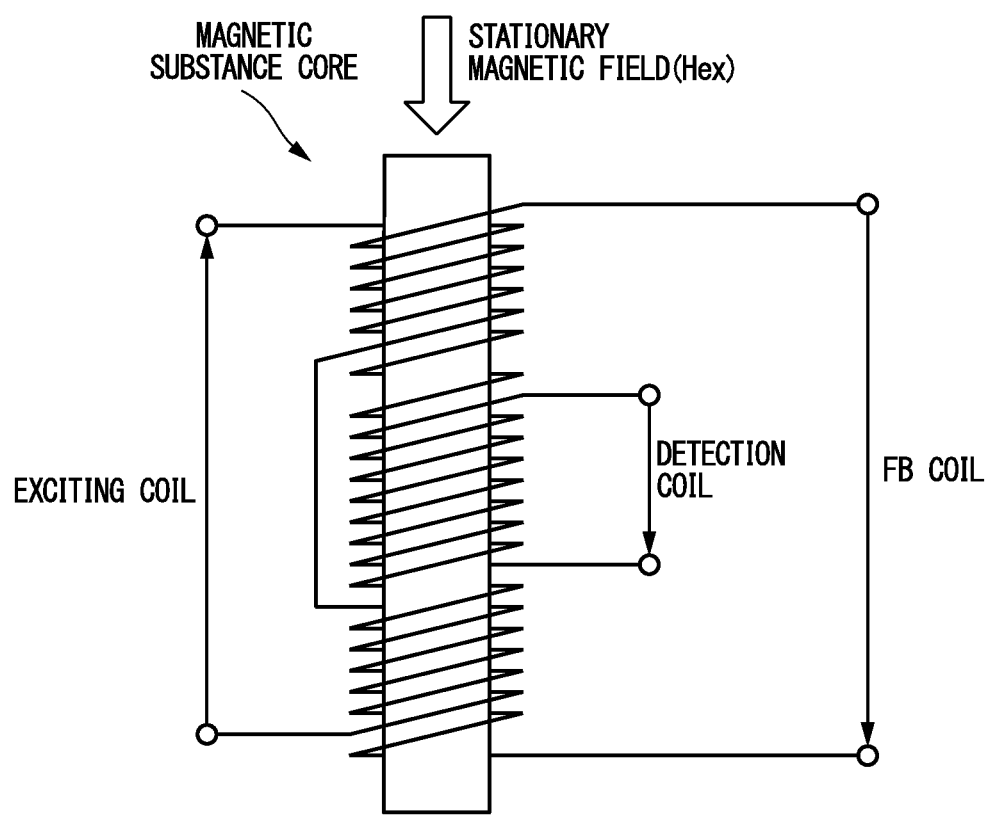
FIG. 12 is a diagram showing a configuration example of a time-resolution FG-type magnetic element (for magnetic balance type measurement).
Figure 13:
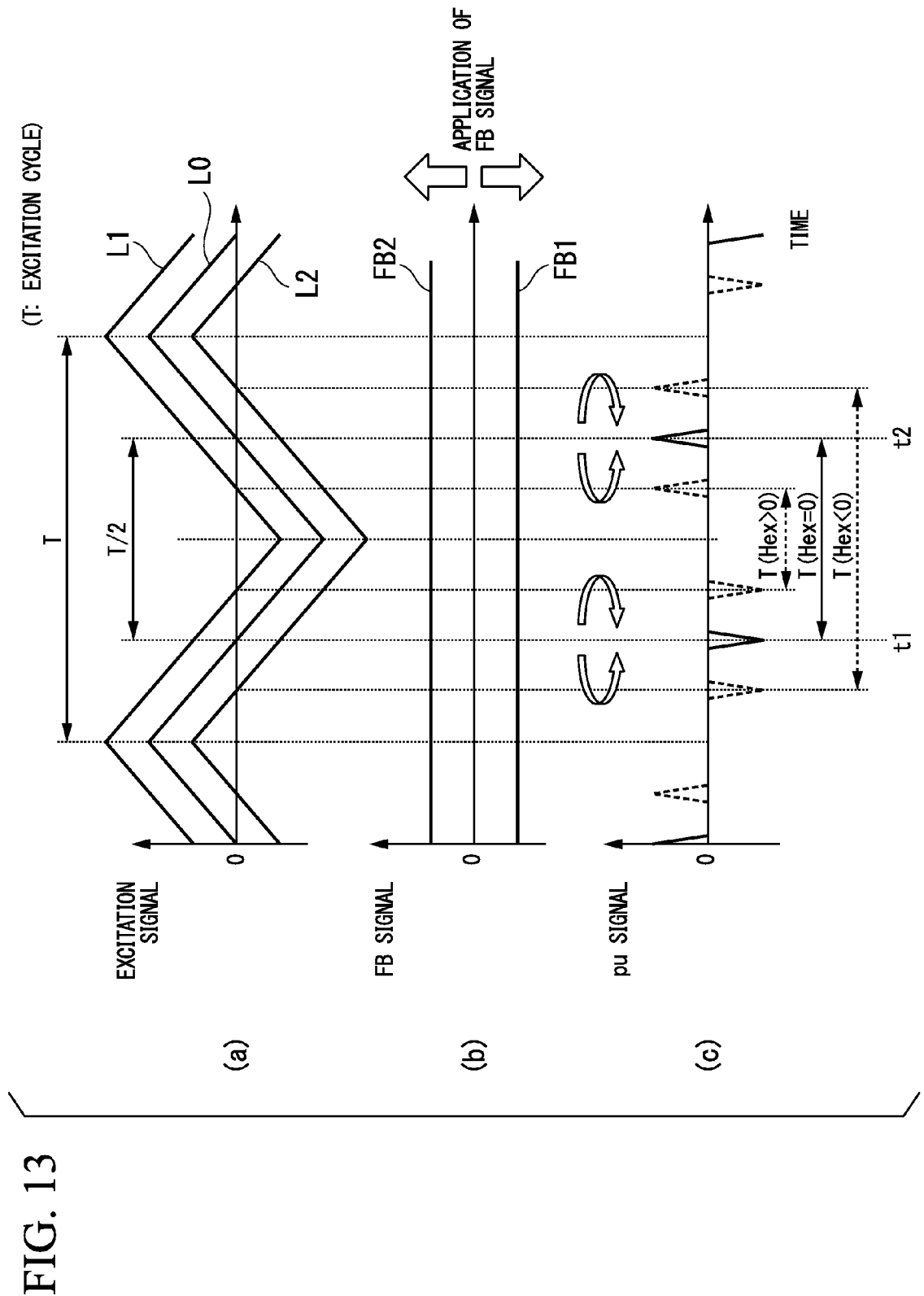
FIG. 13 is a waveform diagram showing a principle of magnetic field detection in a magnetic balance system using the time-resolution FG-type magnetic element.
Figure 14:
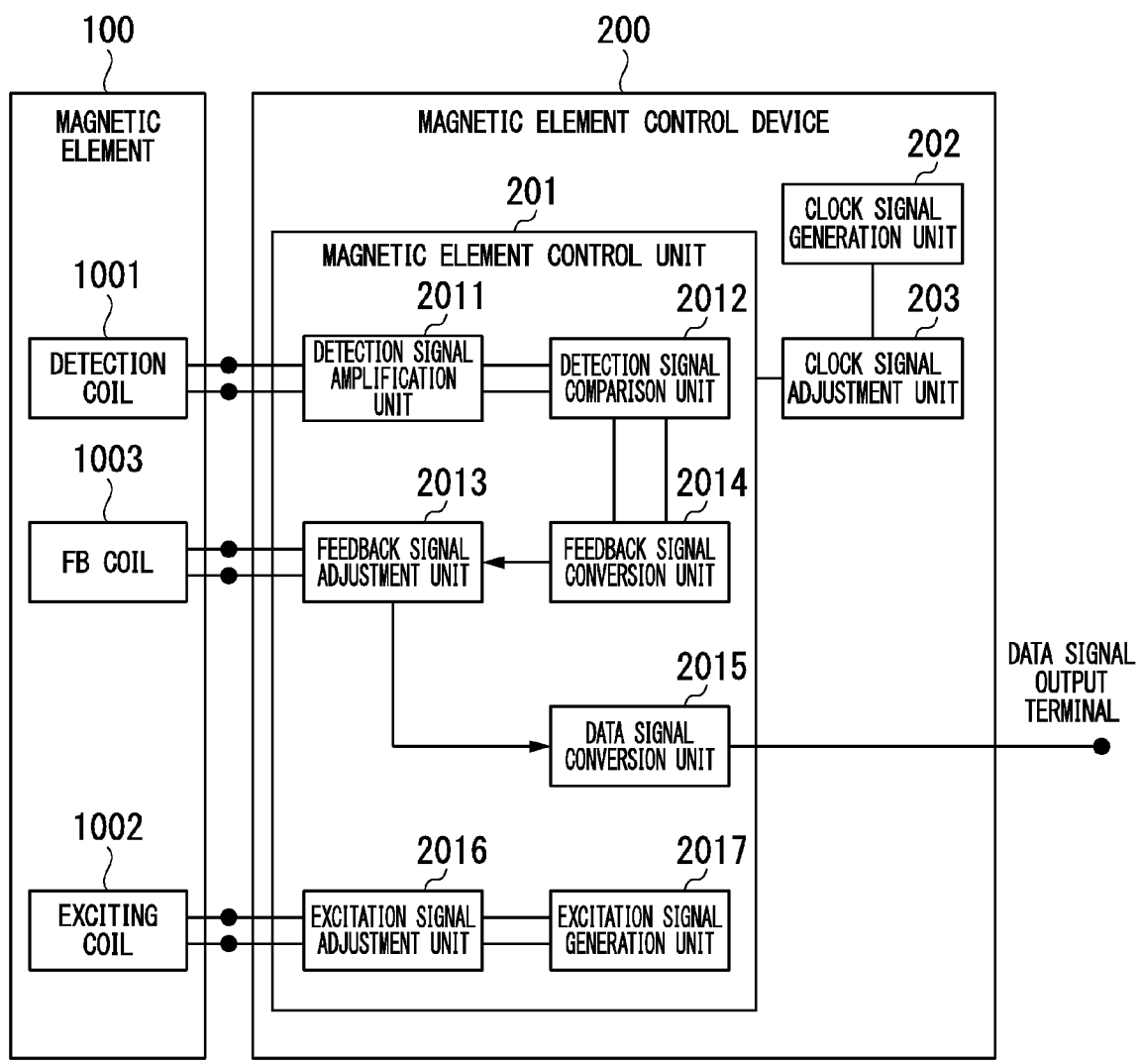
FIG. 14 is a block diagram showing a configuration example of a magnetic detection device using a magnetic element control device in FB control of an FB coil.
Figure 15:
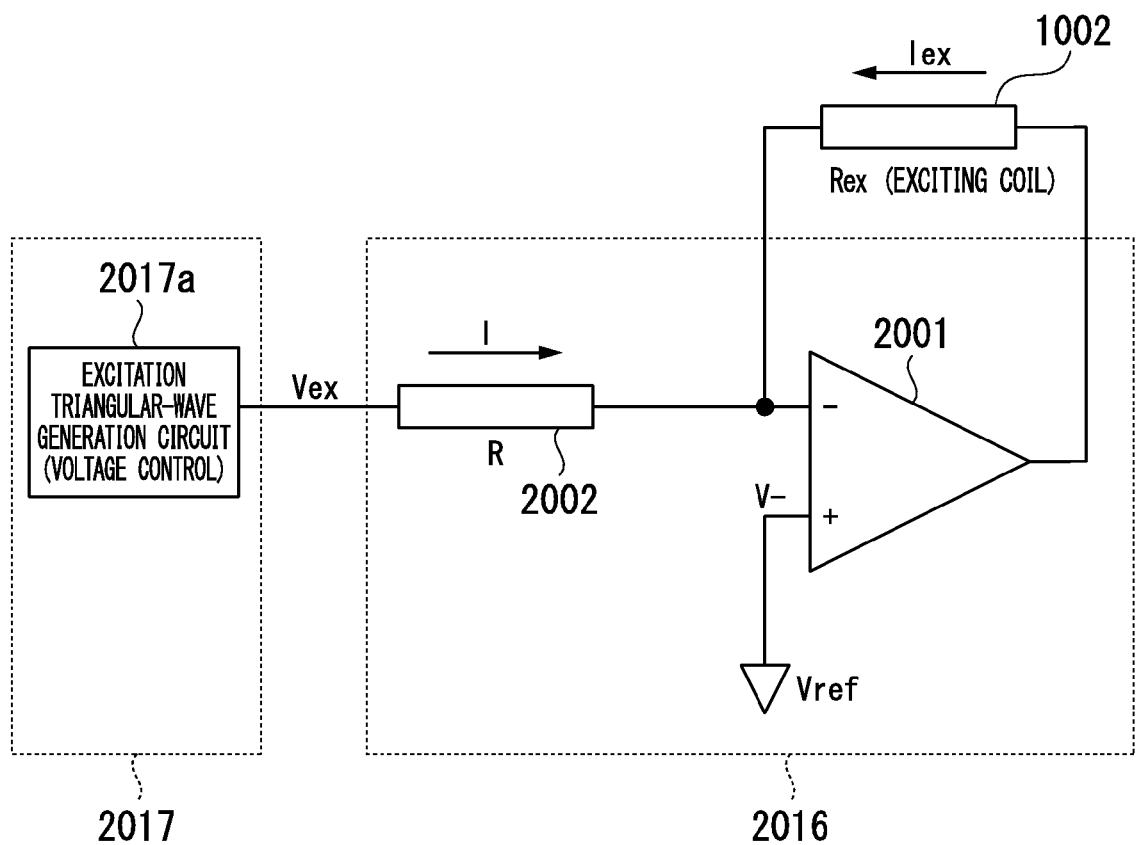
FIG. 15 is a diagram showing a configuration of a voltage-to-current conversion circuit.
Figure 16:
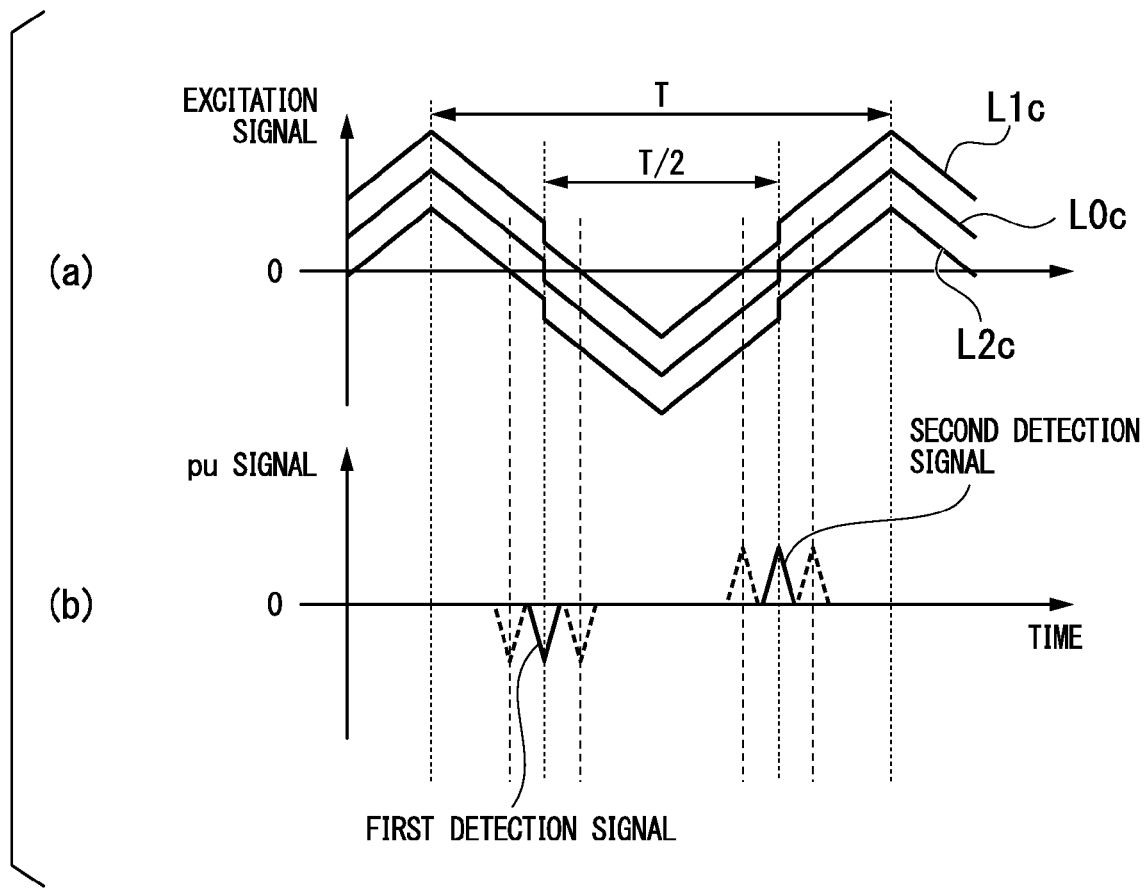
FIG. 16 is a diagram showing a problematic point of the voltage-to-current conversion circuit.

The magnetic element control device 110 includes a magnetic element control unit 111, a clock signal generation unit 102, a clock signal adjustment unit 103, and a data signal determination unit 104. When the intensity of a stationary magnetic field which is applied to a flux-gate type magnetic element 50 constituted by a detection coil 51, an exciting coil 52, and a feedback coil 53 is detected using a time-resolution magnetic balance system, the magnetic element control device 110 controls an excitation signal which is applied to the exciting coil 52, and a feedback signal which is applied to the feedback coil 53. In addition, the configuration of the magnetic element 50 which is a flux-gate type magnetic element is the same as the configuration shown in FIG. 12, and thus the description thereof will not be given.

The magnetic element control unit 111 includes a detection signal amplification unit 1011, a detection signal comparison unit 1012, a feedback signal adjustment unit 1013, a feedback signal generation unit 1014, a data signal conversion unit 1015, an excitation signal adjustment unit 1016, an excitation signal generation unit 1017, and an exciting coil adjustment signal generation unit 1100.

The clock signal generation unit 102 is constituted by an oscillator that generates a clock signal (periodic clock signal) having a predetermined cycle, and outputs a generated clock signal to the clock signal adjustment unit 103.

The clock signal adjustment unit 103 amplifies the signal level of a clock signal to be supplied, or performs processing such as a change in the cycle of the clock signal, and outputs a clock signal of a processing result to the excitation signal generation unit 1017.

The excitation signal generation unit 1017 generates a triangular wave signal as an alternating signal, for example, an alternating voltage signal that alternates using 0 V as a reference potential, on the basis of a clock signal which is supplied from the clock signal adjustment unit 103.

The excitation signal adjustment unit 1016 amplifies the triangular wave signal, generated by the excitation signal generation unit 1017, at a predetermined amplification factor, generates a triangular wave current signal, and applies the generated signal to the exciting coil 52. In this case, the excitation signal adjustment unit 1016 superimposes an offset current signal generated by the exciting coil adjustment signal generation unit 1100 on the triangular wave current signal (the details will be described later).

The exciting coil 52 generates a magnetic field corresponding to a triangular wave within a magnetic substance core of a magnetic element 100.

The detection coil 51 generates a pulse (pu signal) at a positive and negative alternating time zone of the excitation signal in the magnetic substance core.

The detection signal amplification unit 1011 amplifies the voltage level of the pulse which is supplied from the detection coil, and outputs the amplified voltage level, as a detection signal, to the detection signal comparison unit 1012.

Figure 2:
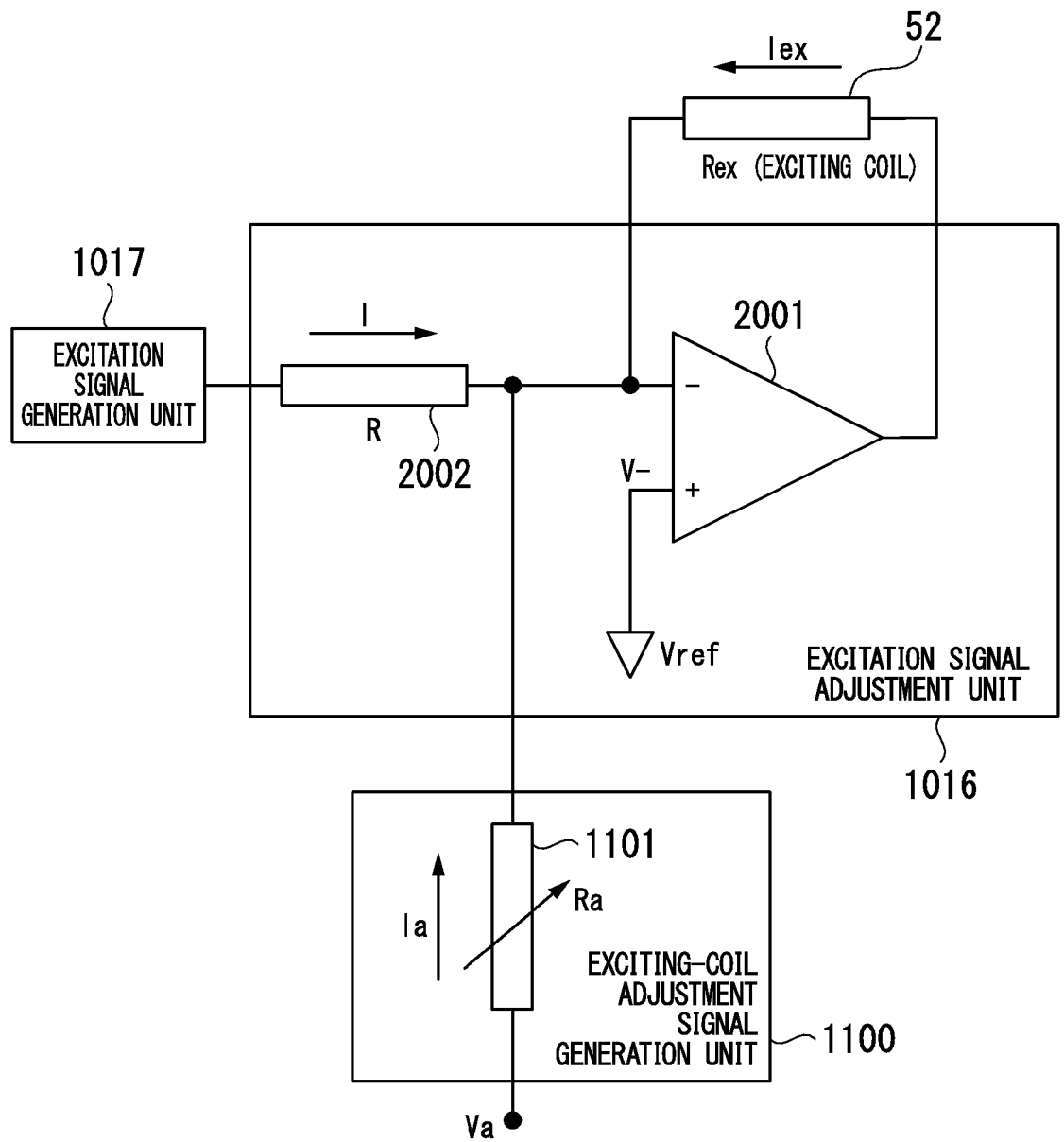
FIG. 2 is a diagram showing a configuration example of a compensation circuit in the magnetic element control device 110.

The compensation circuit shown in FIG. 2 includes the excitation signal generation unit 1017, the excitation signal adjustment unit 1016, and the exciting coil adjustment signal generation unit 1100.

The excitation signal adjustment unit 1016 is constituted by a difference amplifier 2001 and a resistor 2002 (resistance value R).

In the resistor 2002 (second resistor), the first end thereof is connected to the output of the excitation signal generation unit 1017, and the second end thereof is connected to the inverting input terminal of the difference amplifier 2001.

The difference amplifier 2001 is configured such that the non-inverting input terminal thereof is connected to a reference voltage source which is not shown and a reference voltage Vref is input thereto, and that the inverting input terminal thereof is connected to the second end of the resistor 2002.

The exciting coil 52 (resistance value Rex) is connected between the output terminal and the inverting input terminal of the difference amplifier 2001.

The exciting coil adjustment signal generation unit 1100 is constituted by a variable resistor 1101 (first resistor, adjustment resistance value Ra), and is configured such that the first end thereof is connected to the inverting input terminal of the difference amplifier 2001, and that the second end thereof is connected to an exciting coil adjustment voltage input terminal (see FIG. 1). An adjustment voltage (adjustment voltage value Va) is supplied to the exciting coil adjustment voltage input terminal (input terminal capable of inputting an adjustment voltage).

According to the above configuration, in the compensation circuit, when the voltage level (which is set to V−) of the non-inverting input terminal and the voltage level Vex of the triangular wave change, an current Iex is caused to flow to the exciting coil 52 so that the relation of V−=Vref is established.

That is, in a range where the peak value of an exciting voltage (voltage between both ends of the exciting coil 52) is Iex×Rex<Vcc/2 when the power supply voltage level of the difference amplifier 2001 is set to Vcc, the relation of Iex=(Vex−Vref)/R is established. Thereby, since voltage control is performed on Vex, the excitation signal for current control is generated.

In addition, an offset direct current Ia (reference current) of Ioff=(Va−(V−))/Ra is superimposed, by current conversion, on the excitation signal which is applied to the exciting coil 52.

The adjustment of the adjustment voltage value Va and the adjustment resistance value Ra will be described below with reference to FIG. 3. Meanwhile, the adjustment of the adjustment voltage value Va and the adjustment resistance value Ra is executed, for example, during the start-up of the magnetic element control device 110.

Figure 3:
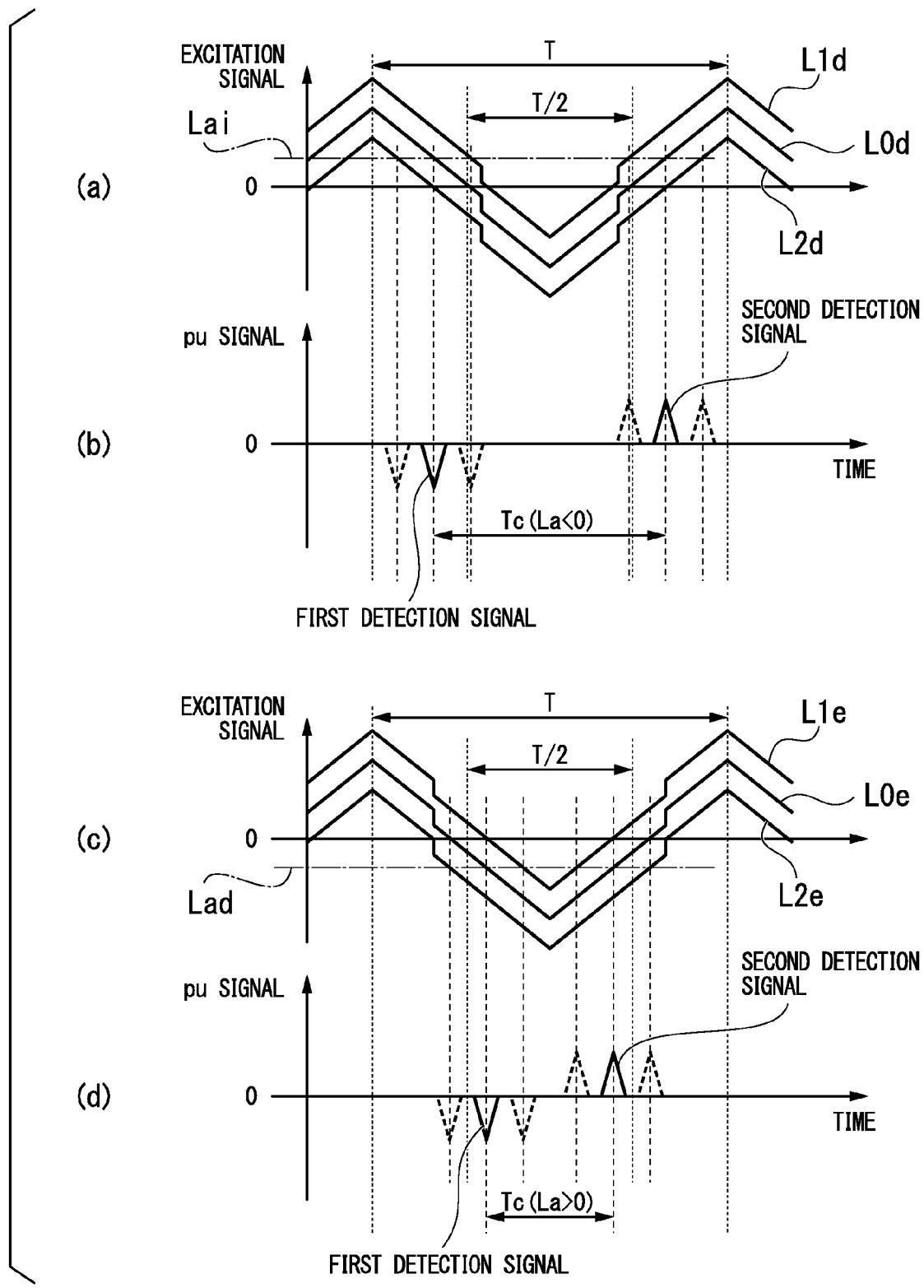
FIG. 3 is a diagram showing a principle of the present invention.

FIG. 3 is a diagram showing a principle of the present invention. PART (a) of FIG. 3 and PART (c) of FIG. 3 are graphs showing the time change of the triangular wave current signal which is supplied to the exciting coil 52, in which the vertical axes thereof represent a voltage, and the horizontal axes represent a time. In PART (a) of FIG. 3 and PART (c) of FIG. 3, the triangular wave current signal which is supplied to the exciting coil 52 is a positive and negative alternating signal bordered by a reference current (reference current value of 0 A as an example in the present embodiment). In PART (b) of FIG. 3 and PART (d) of FIG. 3, the vertical axes thereof represent a voltage, and the horizontal axes thereof represent a time. PART (b) of FIG. 3 and PART (d) of FIG. 3 are graphs showing the time change of detection signals (first detection signal and second detection signal) generated in the detection coil 51 due to an induced electromotive force when the direction of an excitation current flowing through the exciting coil 52 based on the triangular wave voltage signal of PART (a) of FIG. 3 and PART (b) of FIG. 3 changes (the polarity of the voltage value of the triangular wave voltage signal changes, whereby the polarity of the current value of the excitation current changes).

Meanwhile, the excitation signal which is applied to the exciting coil 52 may be a voltage signal. That is, a vertical axis component in PART (a) of FIG. 3 may be a voltage value. In this case, the reference voltage value of the alternating signal in PART (a) of FIG. 3 is set to the reference voltage Vref.

Here, PART (a) of FIG. 3 shows that by the stationary magnetic field (Hex) being applied to the magnetic element 50, the reference current of the triangular wave current signal which is applied to the exciting coil 52 deviates from a reference current value of 0 A by a DC current for generating the applied stationary magnetic field. In addition, it is shown that the reference current corresponds to deviation from a reference current value of 0 A of the triangular wave current signal due to the stationary magnetic field (Hex), and that the generation timings of the first detection signal and the second detection signal deviate temporally.

In addition, in PART (a) of FIG. 3, when the stationary magnetic field is not applied to the magnetic element 50, the current value which is supplied to the exciting coil 52 shows a change corresponding to curve L0d. In addition, in PART (a) of FIG. 3, a case is shown in which when the adjustment of the adjustment voltage value Va and the adjustment resistance value Ra is started, the time width of the pu signal based on curve L0d is shorter than time T/2 which is ½ of cycle T of the triangular wave.

When a stationary magnetic field (lower limit of a measurable magnetic field) in a negative direction is applied, the curve of the excitation signal substantially changes from curve L0d to curve L2d. In addition, when a stationary magnetic field (upper limit of a measurable magnetic field) in a positive direction is applied, the curve of the excitation signal substantially changes from curve L0d to curve L1d.

The adjustment resistance value Ra and the adjustment voltage value Va are set so that straight line Lai indicating a reference current after the superimposition of an offset current and curve L1d intersect each other beyond the linear range of the triangular wave current signal, that is, the range of crossover distortion indicated by curve L1d.

That is, the adjustment resistance value Ra and the adjustment voltage value Va are set so that a constant current La flows from the inverting input terminal of the difference amplifier 2001 in the direction of the exciting coil adjustment voltage input terminal (La<0). Meanwhile, a state where the time width of the pu signal is shorter than time T/2 which is ½ of cycle T of the triangular wave can be confirmed by data which is output by a data signal output terminal during the start of adjustment.

In this case, as shown in PART (a) of FIG. 3, in curve L0d and curve L2d, points of intersection with the reference current (indicated by straight line Lai) do not fall within a range (non-linear region in which the excitation signal does not change linearly) of each of the crossover distortions. For this reason, as shown in PART (b) of FIG. 3, the time width of the pu signal is set to time Tc (La<0). Thereby, since the detection signal which is detected by the detection signal comparison unit can be generated so as to be deviated with respect to the non-linear region of the excitation signal, it is possible to measure a stationary magnetic field while maintaining linearity from the measurement lower limit to the measurement upper limit. That is, when the triangular wave current signal is generated, it is possible to improve the output stability of the device without being influenced by signal distortion which is generated in the excitation signal.

In addition, PART (c) of FIG. 3 shows that by the stationary magnetic field (Hex) being applied to the magnetic element 50, the reference current of the triangular wave current signal which is applied to the exciting coil 52 deviates from a reference current value of 0 A by a DC current for generating the applied stationary magnetic field. In addition, it is shown that the reference current corresponds to deviation from a reference current value of 0 A of the triangular wave current signal due to the stationary magnetic field (Hex), and that the generation timings of the first detection signal and the second detection signal deviate temporally.

In addition, in PART (c) of FIG. 3, when the stationary magnetic field is not applied to the magnetic element 50, the current value which is supplied to the exciting coil 52 shows a change corresponding to curve L0e. In addition, in PART (c) of FIG. 3, a case is shown in which when the adjustment of the adjustment voltage value Va and the adjustment resistance value Ra is started, the time width of the pu signal is longer than time T/2 which is ½ of cycle T of the triangular wave.

When a stationary magnetic field (lower limit of a measurable magnetic field) in a negative direction is applied, the curve of the excitation signal substantially changes from curve L0e to curve L2e. In addition, when a stationary magnetic field (upper limit of a measurable magnetic field) in a positive direction is applied, the curve of the excitation signal substantially changes from curve L0e to curve L1e.

The adjustment resistance value Ra and the adjustment voltage value Va are set so that straight line Lad indicating a reference current after the superimposition of an offset current and curve L2e intersect each other beyond the linear range of the triangular wave current signal, that is, the range of crossover distortion indicated by curve L2e.

That is, the adjustment resistance value Ra and the adjustment voltage value Va are set so that the constant current La flows from the exciting coil adjustment voltage input terminal to the direction of the inverting input terminal of the difference amplifier 2001 (La>0). Meanwhile, a state where the time width of the pu signal is longer than time T/2 which is ½ of cycle T of the triangular wave can be confirmed by data which is output by a data signal output terminal during the start of adjustment.

In this case, as shown in PART (c) of FIG. 3, in curve L0e and curve Lae, points of intersection with the reference current (indicated by straight line Lad) do not fall within the range of each of the crossover distortions. For this reason, as shown in PART (d) of FIG. 3, the time width of the pu signal is set to time Tc (La>0). Thereby, since the detection signal which is detected by the detection signal comparison unit can be generated so as to be deviated with respect to the region (non-linear region) in which the crossover distortion of the excitation signal is generated, it is possible to measure a stationary magnetic field while maintaining linearity from the measurement lower limit to the measurement upper limit. That is, it is possible to improve the output stability of the device without being influenced by signal distortion which is generated in the excitation signal.

Meanwhile, as can be understood from PART (b) of FIG. 3 and PART (d) of FIG. 3, when a difference Td between a time width between the generation time of the first detection signal and the generation time of the second detection signal (between detection signals), and a time Tc (reference time width which is set in advance) is 0, the stationary magnetic field (Hex) is not applied to the magnetic element 50. In addition, a negative stationary magnetic field (Hex<0) is applied when the difference Td is positive, and a positive stationary magnetic field (Hex>0) is applied when the difference Td is negative. The difference Td is calculated in the detection signal comparison unit 1012 described later.

Referring back to FIG. 1, the detection signal amplification unit 1011 amplifies a voltage between both ends of the detection coil 51 of the magnetic element 50, depending on an amplification degree which is set in advance.

The detection signal comparison unit 1012 compares a voltage value of the amplified detection signal which is supplied from the detection signal amplification unit 1011 with a threshold voltage value which is set in advance, and detects the first detection signal and the second detection signal (see PART (b) of FIG. 3 and PART (d) of FIG. 3).

As shown in FIG. 3, the first detection signal is a pulse having a negative polarity (negative voltage), and is generated by an induced electromotive force in a region in which a current applied to the exciting coil 52 changes from a state of being larger than the reference current to a state of being smaller than the reference current. On the other hand, the second detection signal is a pulse having a positive polarity (positive voltage), and is generated by an induced electromotive force in a region in which a current applied to the exciting coil 52 changes from a state of being smaller than the reference current to a state of being larger than the reference current.

In the present embodiment, even when any of a configuration in which digital processing based on an arithmetic operation using a digital value is performed and a configuration in which analog processing based on an arithmetic operation using an analog value is performed is used as a configuration in which the voltage of the feedback signal which is an FB signal is generated, the magnetic element control device 110 can be formed. Hereinafter, a configuration in which the voltage of the feedback signal is generated using digital processing and a configuration in which the voltage of the feedback signal is generated using analog processing will be described in order.

Configuration in which Voltage of Feedback Signal is Generated Using Digital Processing The detection signal comparison unit 1012 measures a time width from the first detection signal to the second detection signal, obtains a difference Td (=Tw−(T/2)) between time widths Tw and Tc, and outputs the resultant to the feedback signal generation unit 1014.

When the difference Td which is time information is supplied from the detection signal comparison unit 1012, the feedback signal generation unit 1014 generates voltage information for generating the voltage of the feedback signal as an FB signal from the difference Td.

Here, a time-voltage information table indicating the correspondence of the difference Td to voltage information of a digital value corresponding to the difference Td is previously written and stored in an internal storage unit of the feedback signal generation unit 1014.

The feedback signal generation unit 1014 reads out voltage information corresponding to the supplied difference Td from the time-voltage information table which is stored in the internal storage unit, and outputs the resultant to the feedback signal adjustment unit 1013. For example, the voltage information is data of a digital value indicating the voltage value of the feedback signal. In addition, the voltage information is given the polarity of the difference Td, that is, has a positive polarity when the difference Td is positive, and has a negative polarity when the difference Td is negative. Therefore, when the stationary magnetic field (Hex) having a positive polarity is applied to the magnetic element 50, a direct current having a negative polarity is superimposed on the current of the feedback signal. On the other hand, when the stationary magnetic field (Hex) having a negative polarity is applied thereto, a direct current having a positive polarity is superimposed on the current of the feedback signal.

The feedback signal adjustment unit 1013 generates a feedback signal of a voltage value indicating the voltage information on the basis of the voltage information which is supplied from the feedback signal generation unit 1014, performs voltage-current conversion on the generated feedback signal, and applies a current as an FB signal to the feedback coil 53.

Here, since the voltage information is a digital value, the feedback signal adjustment unit 1013 includes, for example, a D/A converter therein, inputs the voltage information which is a supplied digital value to the D/A converter to thereby obtain a direct-current voltage, performs voltage-current conversion on a direct-current voltage, and applies the current as an FB signal to the feedback coil 53.

In addition, when the feedback signal is superimposed on the excitation signal, a time interval between the first detection signal and the second detection signal which are detected by the detection signal comparison unit 1012 is located in the vicinity of Tc.

For this reason, in the detection signal comparison unit 1012, when the feedback signal has already superimposed on the excitation signal, the time information which is output shows an error voltage indicating an error between the feedback signal of Tc and the feedback signal which is presently applied. Therefore, when the excitation signal is applied, the detection signal comparison unit 1012 outputs the difference Td, as the time information indicating the above-mentioned error voltage, to the feedback signal generation unit 1014.

When the difference Td which is the time information indicating the error voltage is supplied, as previously stated, the feedback signal generation unit 1014 reads out the voltage information corresponding to the difference Td from the time-voltage information table which is stored in the internal storage unit, and outputs the resultant to the feedback signal adjustment unit 1013.

The feedback signal adjustment unit 1013 includes a storage unit therein, integrates and stores voltage information in the storage unit, and generates the feedback signal using the integrated voltage information.

Here, the feedback signal adjustment unit 1013 determines whether the voltage information corresponding to the difference Td is included in a set voltage range which is set in advance.

When the voltage information is not included in the set voltage range, the feedback signal adjustment unit 1013 determines a stationary magnetic field applied to the magnetic element 50 as a voltage which has no influence on the cancellation thereof.

That is, the feedback signal adjustment unit 1013 determines that the time width between the first detection signal and the second detection signal is substantially Tc due to an error of control accuracy. In this case, the feedback signal adjustment unit 1013 discards voltage information falling within an error range without integrating the voltage information in the time information until just before the internal storage unit.

The data signal conversion unit 1015 amplifies the voltage information which is supplied from the feedback signal adjustment unit 1013, depending on an amplification degree which is set in advance, and outputs the resultant to the data signal determination unit 104.

The amplification degree in the data signal conversion unit 1015 is set to a value by which only a range of the voltage value of the feedback signal in a range capable of being linearly measured in advance is output as a data signal. That is, according to the amplification degree, only a range in which a magnetic field that cancels a stationary magnetic field and a feedback signal having a voltage value for generating the magnetic field maintain linearity corresponds to an amplified voltage, and a voltage falling outside of the range is saturated and is set to a constant voltage. That is, the data signal conversion unit 1015 amplifies and outputs a feedback signal based on an amplification factor, which is set in advance, for saturating a voltage value of a feedback signal falling outside of the voltage range of the feedback signal in which the voltage value of the feedback signal and the magnetic field intensity generated by the voltage value have linearity.

Therefore, the data signal indicates a magnetic field voltage for obtaining the intensity of a magnetic field that cancels a stationary magnetic field, that is, the intensity of a stationary magnetic field The data signal determination unit 104 determines whether the voltage value of a data signal which is supplied from the data signal conversion unit 1015 is included in a data range (output data designated range) which is set in advance, that is, is included between the measurement lower limit and the measurement upper limit. The above data range is previously written and stored in an internal storage unit of the data signal determination unit 104. The data range refers to a range of a voltage value for determining whether a voltage value indicating a data signal which is amplified and output in the data signal conversion unit 1015 is included in a region in which a magnetic field and a voltage value indicating the magnetic field are in a linear relation.

When the voltage value of the data signal is not included in the data range, the data signal determination unit 104 outputs a data signal (error signal) indicating an error to an external magnetic field intensity detection device. In addition, when the voltage value of the data signal is included in the data range, the data signal determination unit 104 outputs a data signal indicating a voltage value to the external magnetic field intensity detection device.

The external magnetic field intensity detection device (not shown) converts the voltage value of the magnetic field voltage indicated by the data signal into the intensity of a magnetic field, and outputs the converted intensity of a magnetic field.

A magnetic field intensity table indicating the correspondence of the voltage value of the magnetic field voltage to the intensity of the magnetic field corresponding to the voltage value of the magnetic field voltage is previously written and stored in an internal storage unit of the magnetic field intensity detection device.

The magnetic field intensity detection device reads out the magnetic field intensity corresponding to the voltage value of the magnetic field voltage indicating the data signal, supplied from the magnetic element control device 110, from the magnetic field intensity table, and displays the resultant, as a numerical value of the intensity of the stationary magnetic field (Hex), for example, on a display unit provided in the magnetic field intensity detection device. In the present embodiment, the magnetic detection device is constituted by the magnetic element control device 110 and the above-mentioned magnetic field intensity detection device (not shown).

Configuration in which Voltage of Feedback Signal is Generated Using Analog Processing The detection signal comparison unit 1012 outputs the first detection signal and the second detection signal to the feedback signal generation unit 1014.

The feedback signal generation unit 1014 generates a pulse having a duty ratio as voltage information on the basis of a cycle (time interval between the first detection signal and the second detection signal, that is, time Tc) in which the first detection signal and the second detection signal are output, and outputs the pulse as voltage information to the feedback signal adjustment unit 1013. That is, the feedback signal generation unit 1014 obtains a duty ratio indicating the voltage value of the feedback signal, as the voltage information, from the above-mentioned time width, and outputs a square wave of the duty ratio indicating the voltage value of the feedback signal to the feedback signal adjustment unit 1013.

When the information is indicated by a square wave signal, the feedback signal adjustment unit 1013 generates a direct-current voltage corresponding to the duty ratio using a PWM (Pulse Width Modulation) circuit or the like, performs voltage-current conversion on the generated feedback signal, and applies the current as an FB signal to the feedback coil 53.

For example, when the time width from the first detection signal to the second detection signal is longer than the time width from the second detection signal to the first detection signal, a stationary magnetic field is required to be negative. For this reason, the feedback signal adjustment unit 1013 generates a feedback signal of a direct-current voltage for generating a positive magnetic field by which the stationary magnetic field is canceled, performs voltage-current conversion on the generated feedback signal, and applies the current as an FB signal to the feedback coil 53.

On the other hand, when the time width from the second detection signal to the first detection signal is longer than the time width from the first detection signal to the second detection signal, the stationary magnetic field is positive, and thus the feedback signal adjustment unit 1013 generates a feedback signal of a direct-current voltage for generating a negative magnetic field by which the stationary magnetic field is canceled, performs voltage-current conversion on the generated feedback signal, and applies the current as an FB signal to the feedback coil 53.

That is, when a pulse which is voltage information is supplied, the feedback signal adjustment unit 1013 generates a feedback signal of a voltage value corresponding to the duty ratio of the pulse, performs voltage-current conversion on the generated feedback signal, and applies the current as an FB signal to the feedback coil 53.

Here, the feedback signal adjustment unit 1013 is provided with a voltage-to-current conversion circuit which is configured using, for example, an operational amplifier. In the voltage-to-current conversion circuit, since an amplifier having an operational amplifier function is used, and the amplifier functions so that a potential difference between a positive input and a negative input is maintained to be zero, a current signal from the output of the amplifier to the positive input thereof has a proportional relation to an external magnetic field. By applying a signal proportional to the current signal, as a feedback signal, to the feedback coil 53, a magnetic field based on the feedback signal is generated, and a magnetic field which is applied to a magnetic substance core within the magnetic element 50 is adjusted so as to become constant. As a result, it is possible to hold the time interval (that is time Tc) between the first detection signal and the second detection signal constant without depending on an external stationary magnetic field.

The operations of the data signal conversion unit 1015 are the same as those in the digital processing except for the amplification of an analog value, and thus the description thereof will not be given.

In addition, the external magnetic field intensity detection device converts a data signal of an analog value which is supplied from the magnetic element control device 110 into a digital value through A/D (Analog/Digital) conversion, and obtains a magnetic field intensity similarly to the operation described in the digital processing.

In this manner, in the present embodiment, the exciting coil adjustment signal generation unit 1100 is included which outputs a direct current adjustment signal, adjusted in advance, which is superimposed with respect to the excitation signal. The excitation signal adjustment unit 1016 generates the excitation signal on the basis of the direct current adjustment signal and applies the generated signal to the exciting coil 52. The time interval between the detection signals which are detected by the detection signal comparison unit 1012 depends on a reference potential of the feedback signal generation circuit (feedback signal generation unit 1014), but the crossover distortion of the excitation triangular wave (excitation triangular wave) depends on a reference potential of the excitation triangular wave generation circuit (excitation signal generation unit 1017). The generation time zone of crossover distortion changes relative to the triangular wave (excitation triangular wave), depending on the amount of the direct current adjustment current. For this reason, since the detection signals which are detected by the detection signal comparison unit 1012 can be generated so as to be deviated with respect to a region (non-linear region) in which the crossover distortion of the excitation signal is generated without change a time interval between the detection signals, it is possible to measure a stationary magnetic field while maintaining linearity from the measurement lower limit to the measurement upper limit.

Therefore, according to the embodiment of the present invention, in the magnetic element control device that detects a magnetic field of a magnetic balance system using a time-resolution FG-type magnetic element, and it is possible to improve the output stability of the device without being influenced by signal distortion which is generated in the excitation signal.

Meanwhile, the above-mentioned description has been given of a case where the feedback signal is a signal for voltage control, but the feedback signal may be a signal for current control. Alternatively, both the signal for voltage control and the signal for current control may be included.

Second Embodiment

Figure 4:
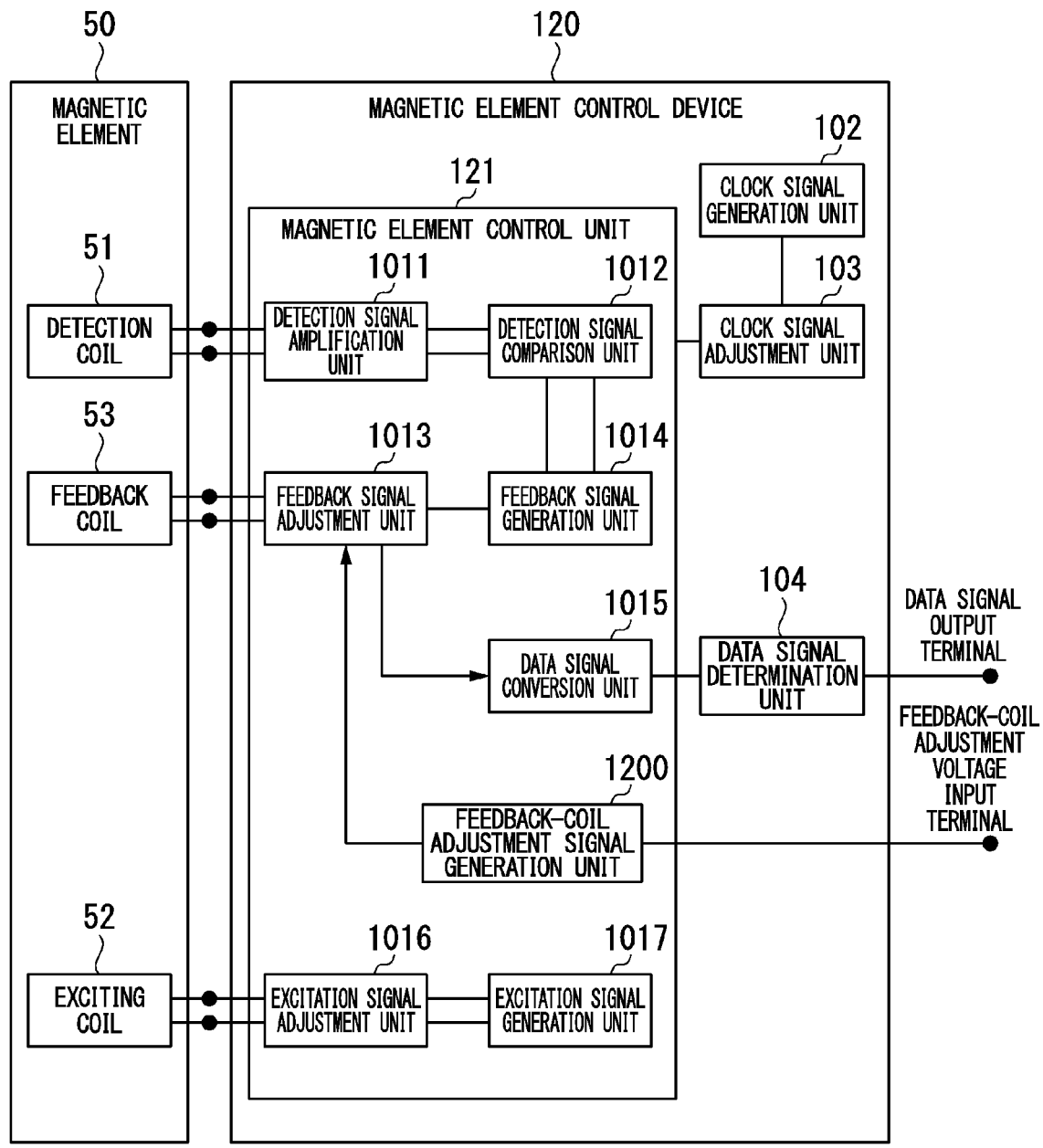
FIG. 4 is a diagram showing a configuration example of a magnetic element control device 120 according to a second embodiment.

A magnetic element control device 120 according to a second embodiment of the present invention will be described with reference to FIGS. 4 and 5. FIG. 4 is a diagram showing a configuration example of the magnetic element control device 120 according to the present embodiment.

In FIG. 4, the same components as those of the magnetic element control device 110 shown in FIG. 1 are denoted by the same reference numerals and signs. In FIG. 4, the magnetic element control device 120 includes a magnetic element control unit 121, a clock signal generation unit 102, a clock signal adjustment unit 103, and a data signal determination unit 104. Hereinafter, only components and operations different from those of the magnetic element control device 110 shown in FIG. 1 will be described.

The magnetic element control unit 121 includes a feedback coil adjustment signal generation unit 1200 in place of the exciting coil adjustment signal generation unit 1100 included in the magnetic element control unit 111.

Figure 5:
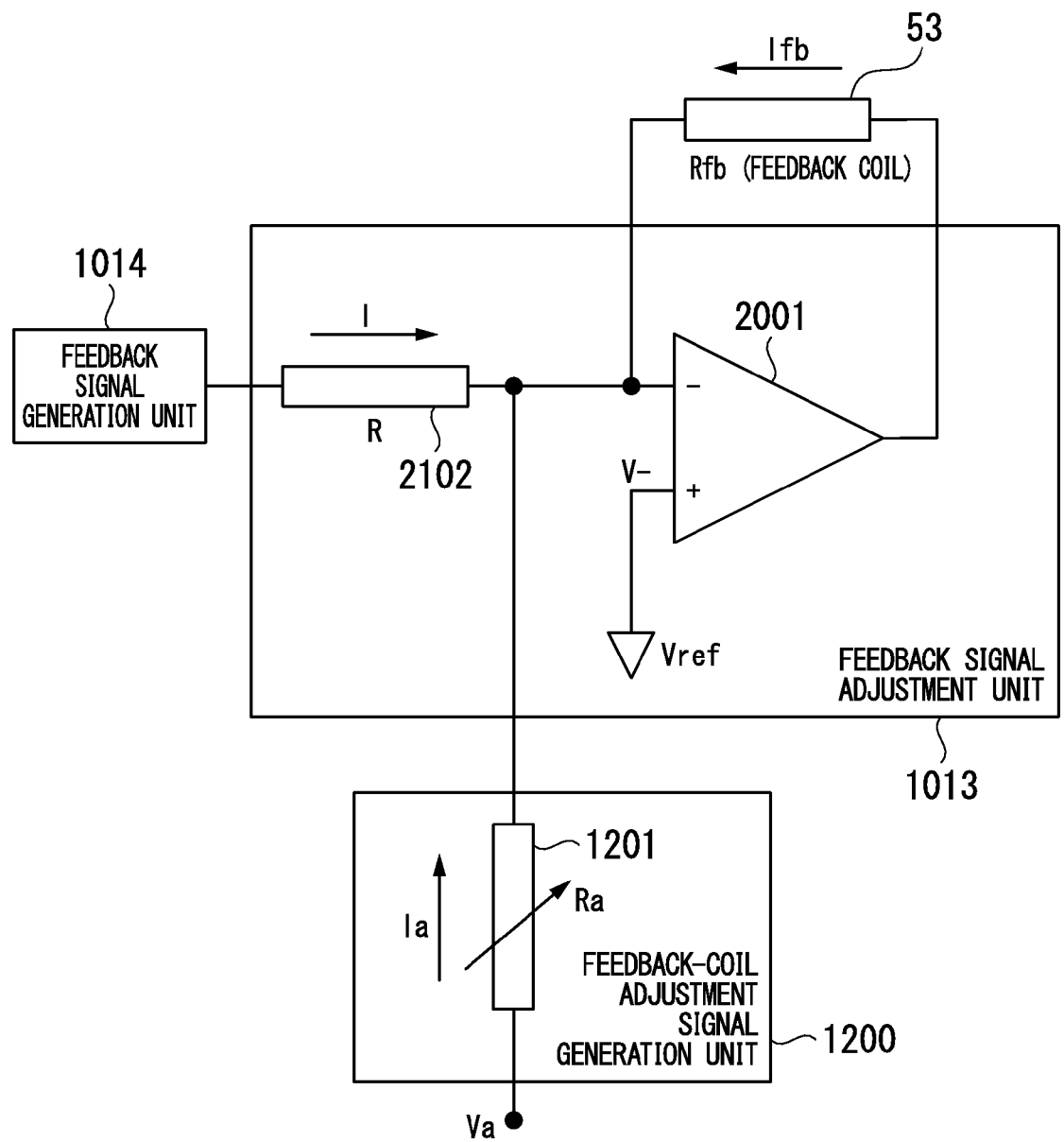
FIG. 5 is a diagram showing a configuration of a compensation circuit in the magnetic element control device 120.

FIG. 5 is a diagram showing a configuration example of a compensation circuit in the magnetic element control device 120.

The compensation circuit shown in FIG. 5 is configured to include a feedback signal generation unit 1014, a feedback signal adjustment unit 1013, and the feedback coil adjustment signal generation unit 1200.

The feedback signal adjustment unit 1013 is constituted by a difference amplifier 2101 and a resistor 2102 (resistance value R).

In the resistor 2102, the first end thereof is connected to the output of the feedback signal generation unit 1014, and the second end thereof is connected to the inverting input terminal of the difference amplifier 2101.

In the difference amplifier 2101, the non-inverting input terminal thereof is connected to a reference voltage source which is not shown and a reference voltage Vref is input thereto, and the inverting input terminal is connected to the second end of the resistor 2102.

The feedback coil 53 (resistance value Rfb) is connected between the output terminal and the inverting input terminal of the difference amplifier 2101.

The feedback coil adjustment signal generation unit 1200 is constituted by a variable resistor 1201 (adjustment resistance value Ra), and is configured such that the first end thereof is connected to the inverting input terminal of the difference amplifier 2101, and that the second end thereof is connected to a feedback coil adjustment voltage input terminal (see FIG. 4). An adjustment voltage (adjustment voltage value Va) is supplied to the feedback coil adjustment voltage input terminal.

According to the above configuration, in the compensation circuit, when the voltage level (which is set to V−) of the non-inverting input terminal and the voltage level Vex (which is set to the voltage level of the output of the feedback signal generation unit 1014) of the triangular wave change, an current Ifb is caused to flow to the feedback coil 53 so that the relation of V−=Vref is established. That is, in a range where the peak value of a feedback voltage (voltage between both ends of the feedback coil 53) is Ifb×Rfb<Vcc/2 when the power supply voltage level of the difference amplifier 2101 is set to Vcc, the relation of Ifb=(Vex−Vref)/R is establish. Thereby, since voltage control is performed on Vex, the feedback signal for current control is generated.

In addition, the offset direct current Ia of Ioff=(Va−(V−))/Ra is superimposed, by current conversion, on the feedback signal which is applied to the feedback coil 53.

The adjustment of the adjustment voltage value Va and the adjustment resistance value Ra has been described with reference to FIG. 3, and thus the description thereof will not be given.

In this manner, in the present embodiment, the feedback coil adjustment signal generation unit 1200 is included which outputs a direct current adjustment signal, adjusted in advance, which is superimposed with respect to the feedback signal. The feedback signal adjustment unit 1013 generates the feedback signal on the basis of the direct current adjustment signal and applies the generated signal to the feedback coil 53. The generation time zone of crossover distortion which is generated on the excitation triangular wave does not change, but the generation time zone of the detection signal changes depending on the amount of the direct current adjustment signal. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

Therefore, in the present embodiment, in the magnetic element control device that detects a magnetic field of a magnetic balance system using a time-resolution FG-type magnetic element, it is also possible to improve the output stability of the device without being influenced by signal distortion which is generated in the excitation signal.

Third Embodiment

Figure 6:
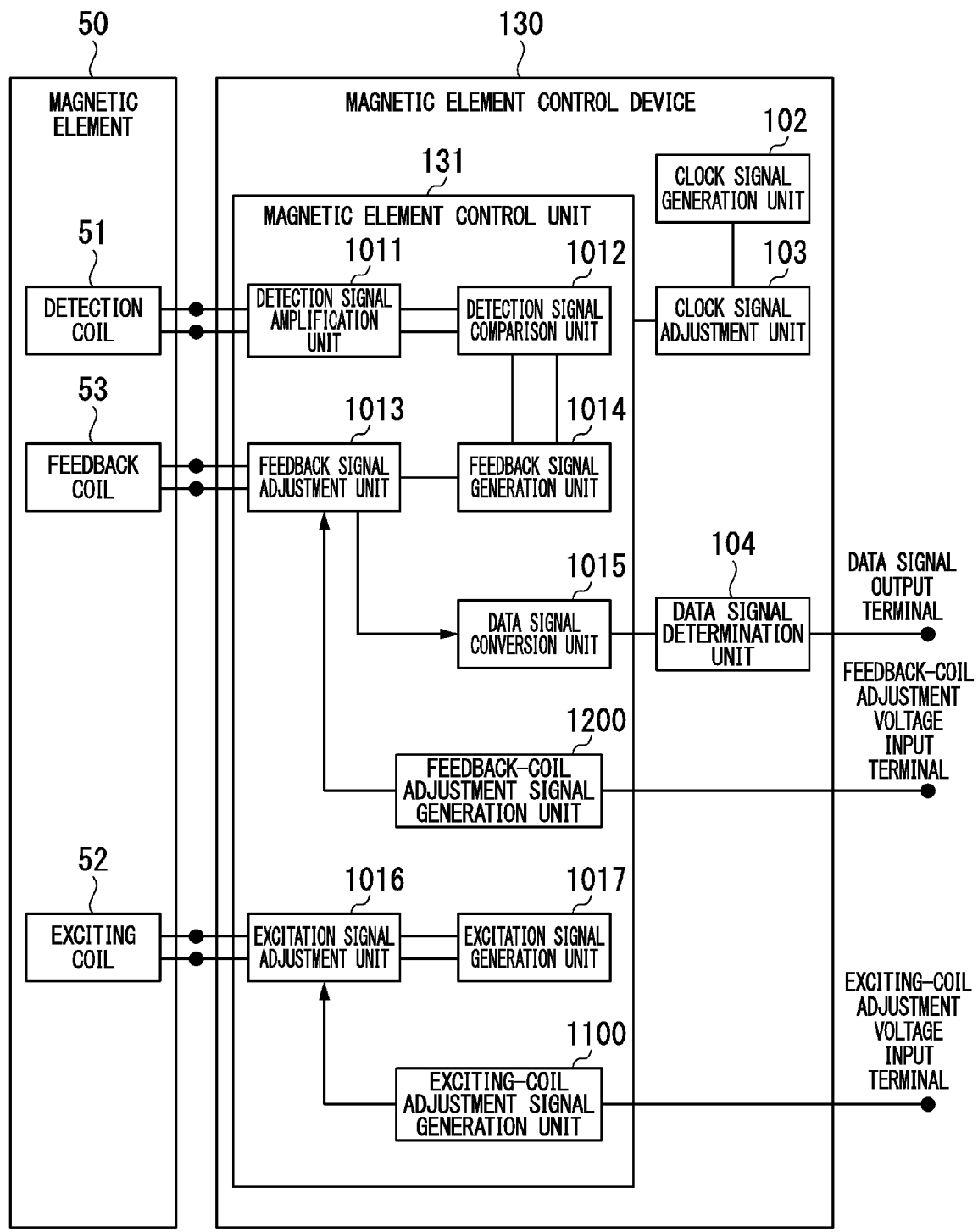
FIG. 6 is a diagram showing a configuration example of a magnetic element control device 130 according to a third embodiment.

A magnetic element control device 130 according to a third embodiment of the present invention will be described with reference to FIG. 6. FIG. 6 is a diagram showing a configuration example of the magnetic element control device 130 according to the third embodiment.

In FIG. 6, the same components as those of the magnetic element control device 110 shown in FIG. 1 and the magnetic element control device 120 shown in FIG. 4 are denoted by the same reference numerals and signs. In FIG. 6, the magnetic element control device 130 includes a magnetic element control unit 131, a clock signal generation unit 102, a clock signal adjustment unit 103, and a data signal determination unit 104. Hereinafter, only components and operations different from those of the magnetic element control device 110 shown in FIG. 1 and the magnetic element control device 120 shown in FIG. 4 will be describe.

The magnetic element control unit 131 includes both an exciting coil adjustment signal generation unit 1100 included in the magnetic element control unit 111, and a feedback coil adjustment signal generation unit 1200 included in the magnetic element control unit 121.

In the present embodiment, the exciting coil adjustment signal generation unit 1100 and the feedback coil adjustment signal generation unit 1200 that output direct current adjustment signals, adjusted in advance, which are superimposed with respect to the excitation signal and the feedback signal, respectively, are included. The excitation signal adjustment unit 1016 and the feedback signal adjustment unit 1013 generate the excitation signal and the feedback signal on the basis of the direct current adjustment signals, and apply the generated signals to the exciting coil 52 and the feedback coil 53, respectively. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

Therefore, in the present embodiment, in the magnetic element control device that detects a magnetic field of a magnetic balance system using a time-resolution FG-type magnetic element, it is also possible to improve the output stability of the device without being influenced by signal distortion which is generated in the excitation signal.

Fourth Embodiment

Figure 7:
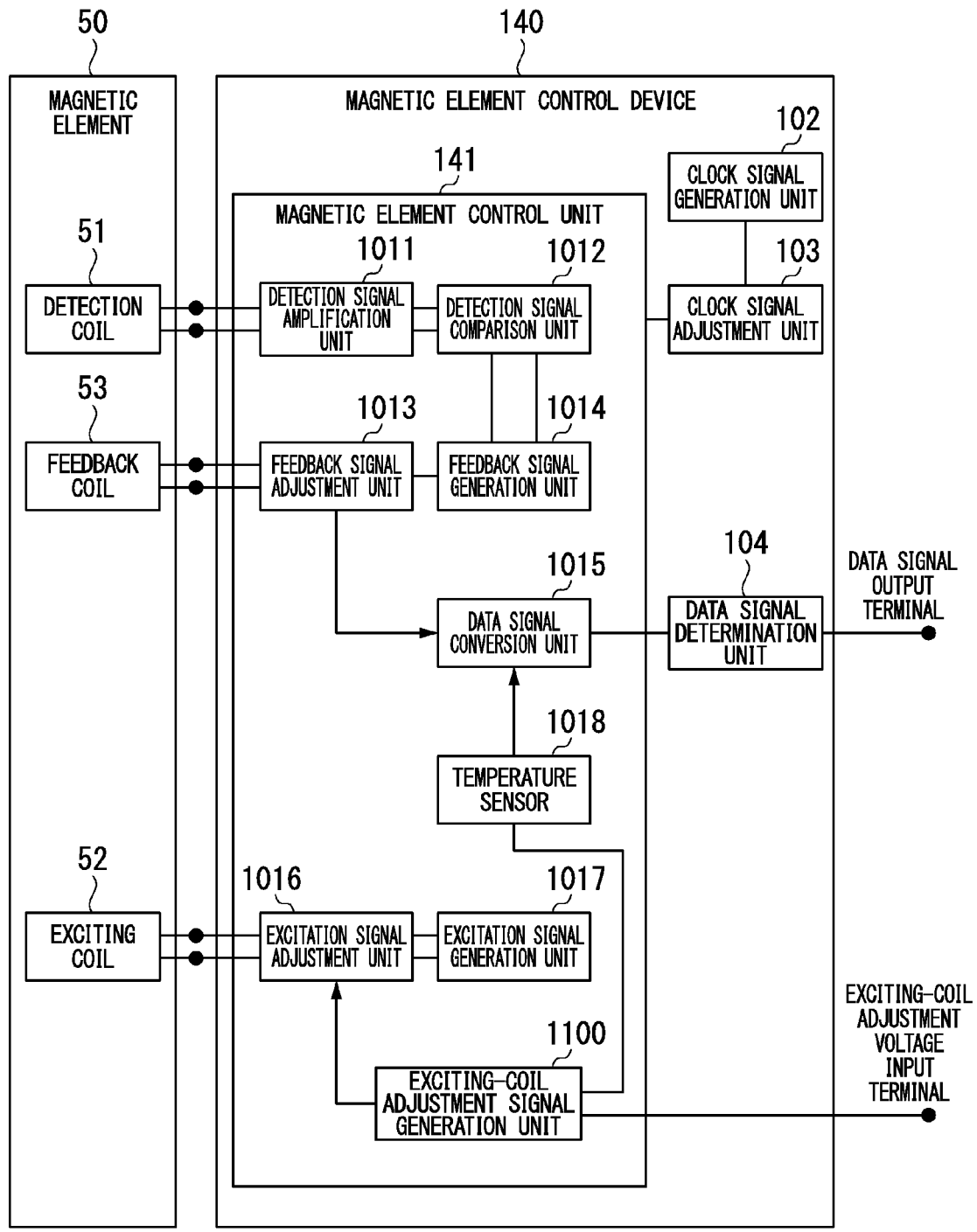
FIG. 7 is a diagram showing a configuration example of a magnetic element control device 140 according to a fourth embodiment.

A magnetic element control device 140 according to a fourth embodiment of the present invention will be described with reference to FIG. 7. FIG. 7 is a diagram showing a configuration example of the magnetic element control device 140 according to the fourth embodiment.

In FIG. 7, the same components as those of the magnetic element control device 110 shown in FIG. 1 are denoted by the same reference numerals and signs. In FIG. 7, the magnetic element control device 140 includes a magnetic element control unit 141, a clock signal generation unit 102, a clock signal adjustment unit 103, and a data signal determination unit 104. Hereinafter, only components and operations different from those of the magnetic element control device 110 shown in FIG. 1 will be described.

The magnetic element control unit 141 further includes a temperature sensor 1018, as compared to the magnetic element control unit 111.

The temperature sensor 1018 measures the temperature of the magnetic element 50, and outputs temperature data indicating the measured temperature to the data signal conversion unit 1015 and the exciting coil adjustment signal generation unit 1100.

Here, in the exciting coil adjustment signal generation unit 1100, an offset correction table indicating the correspondence of a temperature to an offset correction coefficient multiplied by an offset current is previously written and stored in an internal storage unit. The exciting coil adjustment signal generation unit 1100 reads out the offset correction coefficient corresponding to the temperature data which is supplied from the temperature sensor 1018. The exciting coil adjustment signal generation unit 1100 multiplies offset information which is read out from the internal storage unit by the read-out offset correction coefficient, and generates an offset current (direct current adjustment signal after the correction) corresponding to the offset information of the multiplication result. When the device is started up, as described above, the offset current Ia of a constant current is determined in a state of ordinary temperature by the adjustment voltage value Va and the adjustment resistance value Ra. When the ambient temperature of the magnetic element 50 changes after the startup of the device, the offset current Ia changes by the adjustment resistance value Ra changing in response to a change in temperature, and the excitation current also increases or decreases in response to the changed offset current. Meanwhile, the offset correction coefficient is calculated in advance by an experiment or the like and is written in the offset correction table so that crossover distortion does not occur between a maximum value and a minimum value of a stationary magnetic field, in each temperature between a minimum temperature and a maximum temperature which are compensated for by the device.

In addition, in the data signal conversion unit 1015, a voltage information correction table indicating the correspondence of a temperature to a voltage information correction coefficient for correcting the influence of the temperature of voltage information which is supplied from the feedback signal adjustment unit 1013 is previously written and stored in an internal storage unit. The data signal conversion unit 1015 reads out the voltage information correction coefficient corresponding to the temperature data which is supplied from the temperature sensor 1018, from the voltage information correction table. The data signal conversion unit 1015 multiplies the voltage information which is supplied from the feedback signal adjustment unit 1013 by the read-out voltage information correction coefficient, and generates a data signal on the basis of the voltage information of the multiplication result and the corrected offset information.

In this manner, in the present embodiment, as is the case with the first embodiment, the exciting coil adjustment signal generation unit 1100 is included which outputs a direct current adjustment signal, adjusted in advance, which is superimposed with respect to the excitation signal. The excitation signal adjustment unit 1016 generates the excitation signal on the basis of the direct current adjustment signal and applies the generated signal to the exciting coil 52. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

In addition, it is possible to improve the output stability of the device without being influenced by signal distortion which is generated in the excitation signal, in each temperature between a temperature lower limit and a temperature upper limit which are compensated for by the device, on the basis of the temperature data measured by the temperature sensor 1018.

Fifth Embodiment

Figure 8:
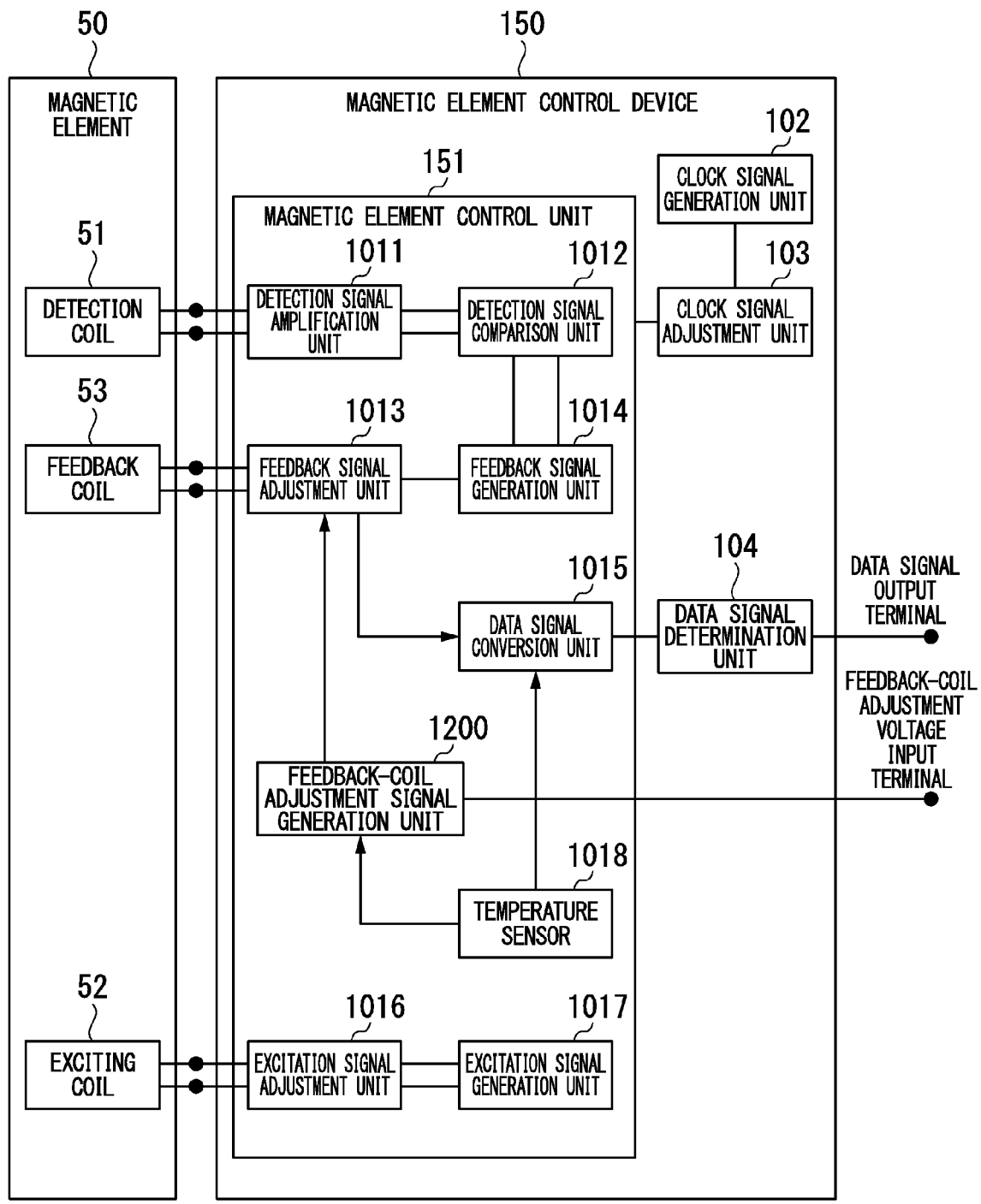
FIG. 8 is a diagram showing a configuration example of a magnetic element control device 150 according to a fifth embodiment.

A magnetic element control device 150 according to a fifth embodiment of the present invention will be described with reference to FIG. 8. FIG. 8 is a diagram showing of a configuration example of the magnetic element control device 150 according to the fifth embodiment.

In FIG. 8, the same components as those of the magnetic element control device 120 shown in FIG. 4 are denoted by the same reference numerals and signs. In FIG. 8, the magnetic element control device 150 includes a magnetic element control unit 151, a clock signal generation unit 102, a clock signal adjustment unit 103, and a data signal determination unit 104. Hereinafter, only components and operations different from those of the magnetic element control device 120 shown in FIG. 4 will be described.

The magnetic element control unit 151 further includes a temperature sensor 1018, as compared to the magnetic element control unit 121.

The temperature sensor 1018 measures the temperature of the magnetic element 50, and outputs temperature data indicating the measured temperature to the data signal conversion unit 1015 and the feedback coil adjustment signal generation unit 1200.

Here, in the feedback coil adjustment signal generation unit 1200, an offset correction table indicating the correspondence of a temperature to an offset correction coefficient multiplied by an offset current is previously written and stored in an internal storage unit. The feedback coil adjustment signal generation unit 1200 reads out the offset correction coefficient corresponding to the temperature data which is supplied from the temperature sensor 1018. The feedback coil adjustment signal generation unit 1200 multiplies offset information which is read out from the internal storage unit by the read-out offset correction coefficient, and generates an offset current corresponding to the offset information of the multiplication result. When the device is started up, as described above, the offset current Ia of a constant current is determined in a state of ordinary temperature by the adjustment voltage value Va and the adjustment resistance value Ra. When the ambient temperature of the magnetic element 50 changes after the startup of the device, the offset current Ia changes by the adjustment resistance value Ra changing in response to a change in temperature, and the excitation current also increases or decreases in response to the changed offset current. Meanwhile, the offset correction coefficient is calculated in advance by an experiment or the like and is written in the offset correction table so that crossover distortion does not occur between a maximum value and a minimum value of a stationary magnetic field, in each temperature between a minimum temperature and a maximum temperature which are compensated for by the device.

In addition, in the data signal conversion unit 1015, a voltage information correction table indicating the correspondence of a temperature to a voltage information correction coefficient for correcting the influence of the temperature of voltage information which is supplied from the feedback signal adjustment unit 1013 is previously written and stored in an internal storage unit. The data signal conversion unit 1015 reads out the voltage information correction coefficient corresponding to the temperature data which is supplied from the temperature sensor 1018, from the voltage information correction table. The data signal conversion unit 1015 multiplies the voltage information which is supplied from the feedback signal adjustment unit 1013 by the read-out voltage information correction coefficient, and generates a data signal on the basis of the voltage information of the multiplication result and the corrected offset information.

In this manner, in the present embodiment, as is the case with the second embodiment, the feedback coil adjustment signal generation unit 1200 is included which outputs a direct current adjustment signal, adjusted in advance, which is superimposed with respect to the feedback signal. The feedback signal adjustment unit 1013 generates the feedback signal on the basis of the direct current adjustment signal and applies the generated signal to the feedback coil 53. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

In addition, it is possible to improve the output stability of the device without being influenced by signal distortion which is generated in the excitation signal, in each temperature between a temperature lower limit and a temperature upper limit which are compensated for by the device, on the basis of the temperature data measured by the temperature sensor 1018.

Sixth Embodiment

Figure 9:
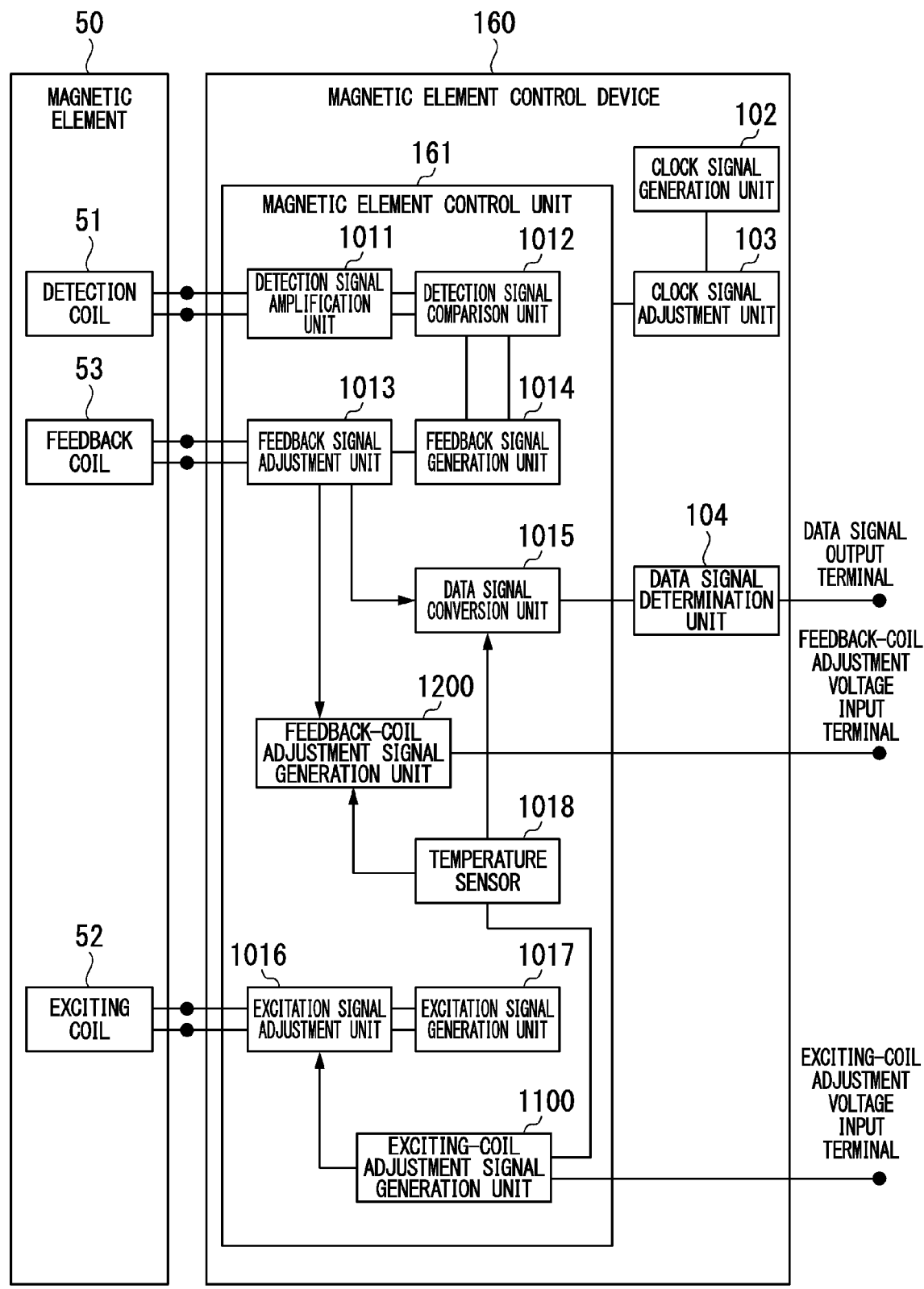
FIG. 9 is a diagram showing a configuration example of a magnetic element control device 160 according to a sixth embodiment.

Next, a magnetic element control device 160 according to a sixth embodiment of the present invention will be described with reference to FIG. 9. FIG. 9 is a diagram showing a configuration example of the magnetic element control device 160 according to the sixth embodiment.

In FIG. 9, the same components as those of the magnetic element control device 130 shown in FIG. 6 are denoted by the same reference numerals and signs. In FIG. 8, the magnetic element control device 160 includes a magnetic element control unit 161, a clock signal generation unit 102, a clock signal adjustment unit 103, and a data signal determination unit 104. Hereinafter, only components and operations different from those of the magnetic element control device 130 shown in FIG. 4 will be described.

The magnetic element control unit 161 further includes a temperature sensor 1018, as compared to the magnetic element control unit 131.

The temperature sensor 1018 measures the temperature of the magnetic element 50, and outputs temperature data indicating the measured temperature to the data signal conversion unit 1015, the exciting coil adjustment signal generation unit 1100, and the feedback coil adjustment signal generation unit 1200.

The exciting coil adjustment signal generation unit 1100 and the feedback coil adjustment signal generation unit 1200 generate offset currents depending on the ambient temperature of the magnetic element 50, as described in the fourth embodiment and the fifth embodiment, respectively.

In the present embodiment, the exciting coil adjustment signal generation unit 1100 and the feedback coil adjustment signal generation unit 1200 that output direct current adjustment signals, adjusted in advance, which are superimposed with respect to the excitation signal and the feedback signal, respectively, are included. The excitation signal adjustment unit 1016 and the feedback signal adjustment unit 1013 generate the excitation signal and the feedback signal on the basis of the direct current adjustment signals, and apply the generated signals to the exciting coil 52 and the feedback coil 53, respectively. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

In addition, it is possible to improve the output stability of the device without being influenced by signal distortion which is generated in the excitation signal, in each temperature between a temperature lower limit and a temperature upper limit which are compensated for by the device, on the basis of the temperature data measured by the temperature sensor 1018.

Figure 10:
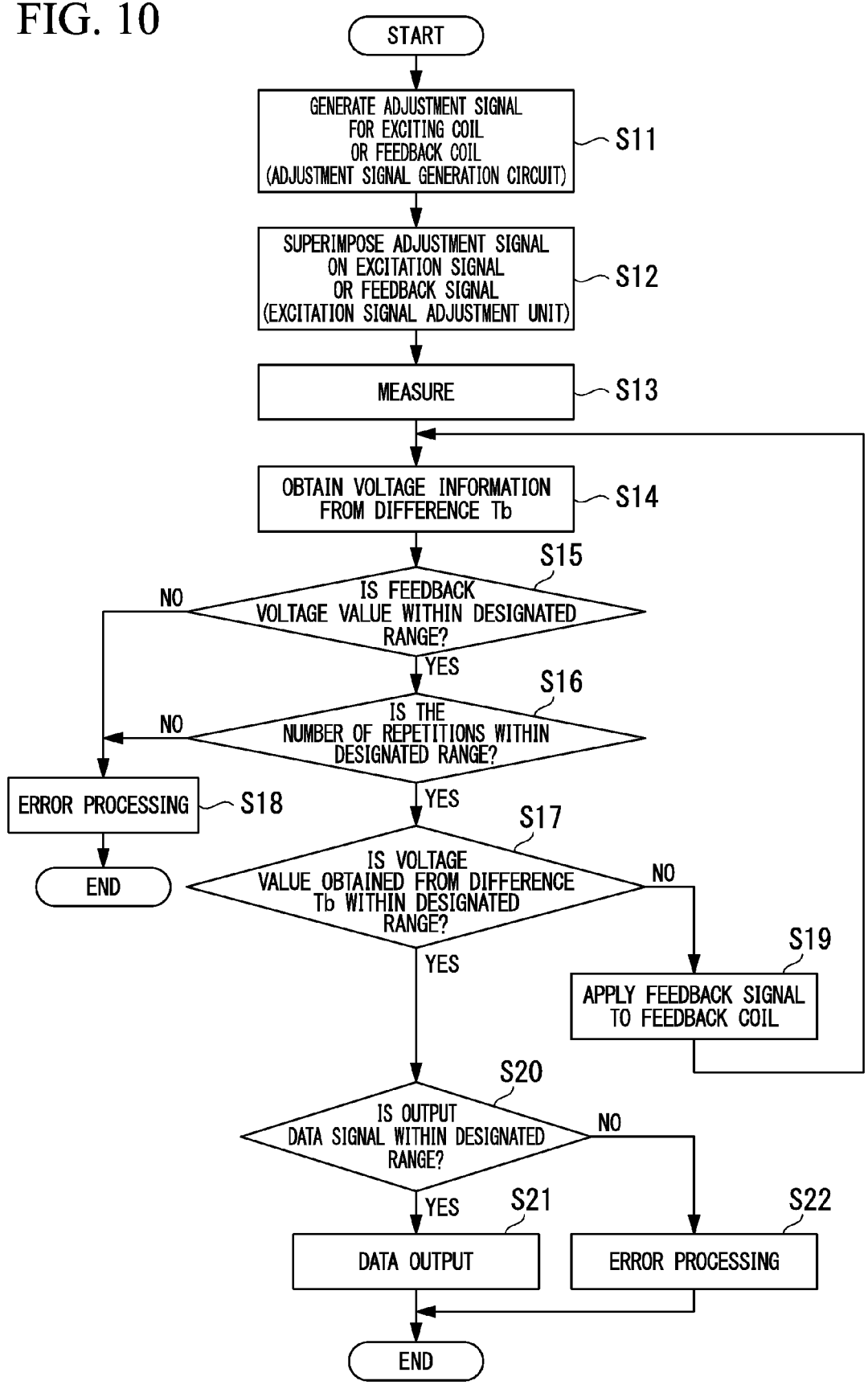
FIG. 10 is a flow diagram showing an operation example of magnetic element control processing (intermittent feedback operation processing) performed by the magnetic element control device.
Figure 11:
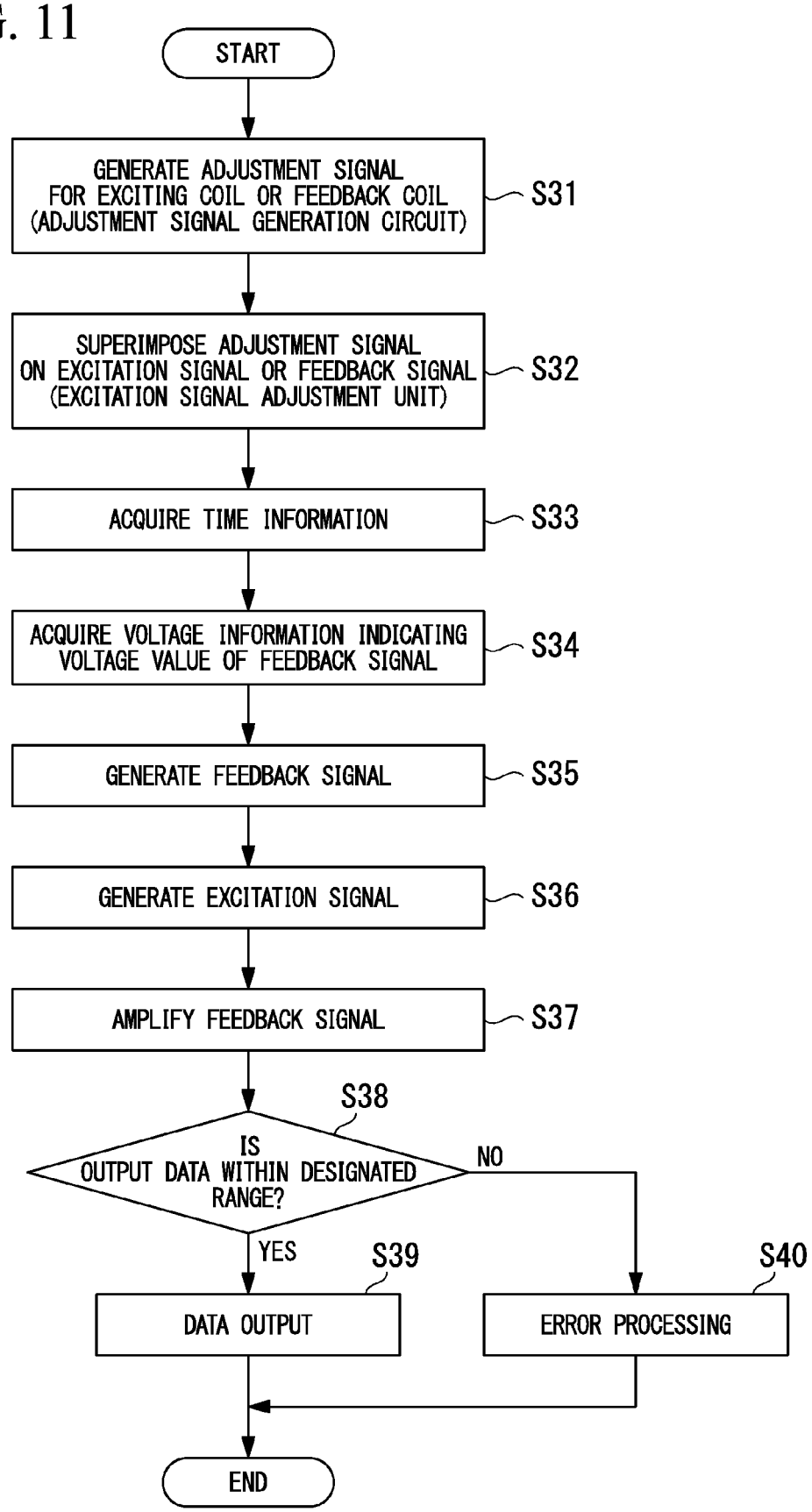
FIG. 11 is a flow diagram showing an operation example of magnetic element control processing (continuous feedback operation processing) performed by the magnetic element control device.

Next, operations of the magnetic element control devices in the above-mentioned first to sixth embodiments will be described with reference to FIGS. 10 and 11. FIG. 10 is a flow diagram showing an operation example of magnetic element control processing (intermittent feedback operation processing) performed by the magnetic element control device. In addition, FIG. 11 is a flow diagram showing an operation example of magnetic element control processing (continuous feedback operation processing) performed by the magnetic element control device. FIG. 10 shows processing when, in a case where a plurality of magnetic elements 50 are connected to one magnetic element control device, the respective magnetic elements 50 are sequentially driven (intermittently operated). In addition, FIG. 11 shows processing when, in a case where one magnetic element 50 is connected to one magnetic element control device, the magnetic elements 50 are continuously driven (continuously operated). In the processing shown in the flow diagram, a description will be given using an example in which the feedback signal is generated by digital processing. In addition, a case where the feedback signal is generated by analog processing can also be processed similarly on the basis of these operations of the flow diagram.

First, the operation example of the magnetic element control processing (intermittent feedback operation processing) performed by the magnetic element control device will be described with reference to FIG. 10.

Step S11:

Since the offset current Ia is set to the excitation signal of the exciting coil 52 or the feedback signal of the feedback coil 53 in a state of room temperature and a zero magnetic field (stationary magnetic field=0), the adjustment voltage value Va and the adjustment resistance value Ra are adjusted in the exciting coil adjustment signal generation unit 1100 or the feedback coil adjustment signal generation unit 1200.

Step S12:

The excitation signal adjustment unit 1016 or the feedback signal adjustment unit 1013 convert a voltage which is output by each of the excitation signal generation unit 1017 and the feedback signal generation unit 1014 into a current. The excitation signal adjustment unit 1016 or the feedback signal adjustment unit 1013 superimposes the offset current Ia, generated by the exciting coil adjustment signal generation unit 1100 or the feedback coil adjustment signal generation unit 1200, on the current after the conversion. After the superimposition of the offset current Ia, the excitation signal adjustment unit 1016 or the feedback signal adjustment unit 1013 applies the excitation signal of a current value to the exciting coil 52, or applies the feedback signal of a current value to the feedback coil 53.

Step S13:

The detection signal amplification unit 1011 amplifies a voltage between both ends of the detection coil 51, and outputs the amplified voltage to the detection signal comparison unit 1012.

The detection signal comparison unit 1012 subtracts Tc which is a reference time width from a time width Tw between a time when the first detection signal is detected and a time when the second detection signal is detected, and outputs a difference Td of the subtraction result, as measured time information, to the feedback signal generation unit 1014.

Step S14:

Next, the feedback signal generation unit 1014 obtains a voltage value corresponding to the difference Td from the difference Td which is supplied from the detection signal comparison unit 1012, and outputs the voltage value, as voltage information, to the feedback signal adjustment unit 1013.

When the voltage information is supplied, the feedback signal adjustment unit 1013 adds a voltage value indicating the voltage information to the voltage value of the immediately preceding feedback voltage which is written in an internal storage unit, and sets the addition result to the voltage value of a new feedback voltage.

Step S15:

The feedback signal adjustment unit 1013 determines whether the voltage value of the new feedback voltage of the addition result is equal to or lower than a maximum voltage (within a designated range) which is set in advance. The maximum voltage is a first voltage threshold range (range of a voltage value having a polarity of − to +) for specifying the range of the voltage value of the feedback voltage which is applied to the exciting coil 52, and is set to, for example, a voltage of approximately 90% of the voltage value of absolute maximum rating by which the exciting coil is damaged when applied.

In this case, when the feedback voltage is included in the first voltage threshold range, the process of the feedback signal adjustment unit 1013 proceeds to step S16. When the feedback voltage is not included in the first voltage threshold range, the process proceeds to step S18.

In addition, when it is determined that the feedback voltage is included in the first voltage threshold range, the feedback signal adjustment unit 1013 performs count processing of a counter provided therein, that is, increases a count value (adds 1 to a count value).

Step S16:

Next, the feedback signal adjustment unit 1013 determines whether the count value of the counter provided therein is less than a count threshold which is previously written and stored (set in the internal storage unit) in the internal storage unit.

In this case, when the count value of the counter is less than the count threshold, the process of the feedback signal adjustment unit 1013 proceeds to step S17. On the other hand, when the count value is equal to or greater than the count threshold, the process proceeds to step S18.

The above count threshold is a value which is set in consideration of a case of no convergence when the feedback voltage is obtained. Therefore, based on the count threshold, obtained is the number of repetitions of the calculation of the feedback voltage which is capable of measuring the magnetic field intensity of the stationary magnetic field within an error range by applying the constant stationary magnetic field to the magnetic element 50, that is, capable of calculating the feedback voltage for canceling the stationary magnetic field. A numerical value obtained by multiplying, for example, the number of repetitions by any multiple (any numerical value such as 2) on the basis of the number of repetitions is set to the count threshold, and the feedback signal adjustment unit 1013 writes and stores the resultant in a storage unit provided therein.

Step S17:

Next, the feedback signal adjustment unit 1013 determines whether the absolute value of the voltage value of the voltage information obtained from the difference Td is less than a second voltage threshold which is set in advance.

In this case, when the voltage value of the voltage information obtained from the difference Td is equal to or greater than the second voltage threshold, the process of the feedback signal adjustment unit 1013 proceeds to step S20. On the other hand, when the voltage value of the voltage information is less than the second threshold, the process proceeds to step S19.

Here, even when the second voltage threshold range is added to a present feedback voltage, it is determined whether the range is a voltage value for changing a magnetic field intensity exceeding a measurement error. Therefore, the feedback signal adjustment unit 1013 determines the voltage value included in the second voltage threshold range to be a voltage value for changing only a magnetic field intensity within an error in the measurement, and does not perform processing of adding the voltage value indicating the voltage information to the feedback voltage integrated in an internal storage unit. In addition, the second voltage threshold range is obtained by an experiment or the like, and is previously written and stored in an internal storage unit of the feedback signal adjustment unit 1013.

Step S18:

The feedback signal adjustment unit 1013 disables the stationary magnetic field which is presently applied to the magnetic element 50 from being measured, and outputs an error signal to the external magnetic field intensity detection device through the data signal determination unit 104.

By the error signal being supplied, the magnetic field intensity detection device causes a display unit to display a notification indicating that the stationary magnetic field which is presently applied to the magnetic element 50 is disabled from being measured.

Step S19:

Next, the feedback signal adjustment unit 1013 writes and stores a newly obtained feedback voltage in an internal storage unit, as an immediately preceding feedback voltage.

In addition, the feedback signal adjustment unit 1013 generates a voltage corresponding to the voltage value of the feedback voltage newly obtained, performs voltage-current conversion on the generated feedback signal, and applies the current as an FB signal to the feedback coil 53. In this case, when the feedback signal adjustment unit 1013 includes the feedback coil adjustment signal generation unit 1200 that outputs a direct current adjustment signal, adjusted in advance which is superimposed with respect to the feedback signal, the feedback signal adjustment unit superimposes the direct current adjustment signal generated by the feedback coil adjustment signal generation unit 1200 to thereby generate the feedback signal, and applied the generated signal to the feedback coil 53. In this case, when the voltage value of the feedback voltage is not obtained, the feedback signal adjustment unit 1013 performs voltage-current conversion on the voltage value of an immediately preceding feedback voltage, and applies a current as an FB signal to the feedback coil 53.

The excitation signal adjustment unit 1016 performs voltage-current conversion on a triangular wave voltage signal from a triangular wave which is supplied from the excitation signal generation unit 1017, and applies a current as the excitation signal to the exciting coil 52. In this case, when the excitation signal adjustment unit 1016 includes the exciting coil adjustment signal generation unit 1100 that outputs a direct current adjustment signal, adjusted in advance, which is superimposed with respect to the excitation signal, the excitation signal adjustment unit 1016 superimposes the direct current adjustment signal generated by the exciting coil adjustment signal generation unit 1100 to generate the excitation signal, and applies the generated signal to the exciting coil 52.

Thereafter, the process of the excitation signal adjustment unit 1016 returns to step S11.

Next, the feedback signal adjustment unit 1013 reads out the voltage value of the feedback voltage which is stored in the internal storage unit, and outputs the read-out voltage value to the data signal conversion unit 1015.

The data signal conversion unit 1015 amplifies the voltage value of the feedback voltage supplied from the feedback signal adjustment unit 1013 based on an amplification factor which is set in advance, and outputs the amplified voltage value, as a data signal, to the data signal determination unit.

Step S20:

The data signal determination unit 104 determines whether the voltage value indicating the data signal which is supplied from the data signal conversion unit 1015 is included in the data range which is stored in the internal storage unit. In this case, when the voltage value indicating the data signal is included in the data range, the process of the data signal determination unit 104 proceeds to step S22. On the other hand, when the voltage value indicating the data signal is not included in the data range, the process of the data signal determination unit 104 proceeds to step S23.

Step S21:

The data signal determination unit 104 outputs the data signal which is supplied from the data signal conversion unit 1015, to the external magnetic field detection device.

As previously stated, the magnetic field detection device reads out a magnetic field intensity corresponding to a voltage value indicating a data signal which is supplied from the magnetic element control device 130, from the magnetic field intensity table stored in the internal storage unit, and causes a display unit of the magnetic field detection device to display the resultant.

Step S22:

Next, the data signal determination unit 104 discards the data signal supplied from the data signal conversion unit 1015, and outputs an error signal to the external magnetic field detection device.

As previously stated, when the error signal is supplied from the magnetic element control device 130, the magnetic field detection device causes the display unit of the magnetic field detection device to display a notification indicating that the applied stationary magnetic field is disabled from being measured.

Exciting coils of a plurality of magnetic elements are driven in order using the function of an intermittent operation, and thus a stationary magnetic field can be measured by one magnetic element control device and a plurality of magnetic elements.

For example, magnetic elements are provides so that the respective measurement axes of three magnetic elements, that is, three axes of an x-axis, a y-axis and a z-axis are at right angles to each other, and thus can be used in the control of magnetic elements of other axes that measures the magnetic field intensity and the direction of a magnetic field in a three-dimensional space.

In addition, in a case of an embodiment in which the temperature sensor 1018 is used, the voltage information and the temperature compensation of the excitation signal or the feedback signal are performed.

Next, the operation example of the magnetic element control processing (continuous feedback operation processing) performed by the magnetic element control device will be described with reference to FIG. 11.

Step S31:

Since the offset current Ia is set to the excitation signal of the exciting coil 52 or the feedback signal of the feedback coil 53 in a state of room temperature and a zero magnetic field (stationary magnetic field=0), the adjustment voltage value Va and the adjustment resistance value Ra are adjusted in the exciting coil adjustment signal generation unit 1100 or the feedback coil adjustment signal generation unit 1200.

Step S32:

The excitation signal adjustment unit 1016 or the feedback signal adjustment unit 1013 convert a voltage which is output by each of the excitation signal generation unit 1017 and the feedback signal generation unit 1014 into a current. The excitation signal adjustment unit 1016 or the feedback signal adjustment unit 1013 superimposes the offset current Ia, generated by the exciting coil adjustment signal generation unit 1100 or the feedback coil adjustment signal generation unit 1200, on the current after the conversion. After the superimposition of the offset current Ia, the excitation signal adjustment unit 1016 or the feedback signal adjustment unit 1013 applies the excitation signal of a current value to the exciting coil 52, or applies the feedback signal of a current value to the feedback coil 53.

Step S33:

The detection signal amplification unit 1011 amplifies a voltage between both ends of the detection coil 51, and outputs the amplified voltage to the detection signal comparison unit 1012.

The detection signal comparison unit 1012 subtracts Tc which is a reference time width from a time width Tw between a time when the first detection signal is detected and a time when the second detection signal is detected, and outputs a difference Td of the subtraction result, as time information, to the feedback signal generation unit 1014. In addition, when the time information is converted into a digital value, it is preferable to use a TDC (Time to Digital Converter) or the like.

Step S34:

The feedback signal generation unit 1014 reads out voltage information indicating the voltage value of the feedback signal corresponding to the difference Td which is time information to be supplied, from the time-voltage information table which is stored in the storage unit. The feedback signal generation unit 1014 outputs the read-out voltage information to the feedback signal adjustment unit 1013.

Step S35:

The feedback signal adjustment unit 1013 reads out immediately preceding voltage information, indicating the feedback signal superimposed on a present triangular wave voltage signal, which is stored in the internal storage unit.

The feedback signal adjustment unit 1013 adds voltage information, supplied from the detection signal, to voltage information which is read out from the storage unit.

The feedback signal generation unit 1014 generates a feedback signal having a voltage value indicated by the voltage information, on the basis of the voltage information of the addition result, performs voltage-current conversion on the generated feedback signal, and applies the current as an FB signal to the feedback coil 53. In this case, when the feedback signal adjustment unit 1013 includes the feedback coil adjustment signal generation unit 1200 that outputs a direct current adjustment signal, adjusted in advance which is superimposed with respect to the feedback signal, the feedback signal adjustment unit superimposes the direct current adjustment signal generated by the feedback coil adjustment signal generation unit 1200 to thereby generate the feedback signal, and applied the generated signal to the feedback coil 53.

In addition, the feedback signal generation unit 1014 writes and stores the voltage information of the addition result as a new immediately preceding voltage information in the internal storage unit, and outputs the voltage information (digital value) to the data signal conversion unit 1015.

Step S36:

The excitation signal adjustment unit 1016 performs voltage-current conversion on a triangular wave voltage signal synchronized with a clock signal which is output by the clock signal adjustment unit 103, and applies a current as the excitation signal to the exciting coil 52. In this case, when the excitation signal adjustment unit 1016 includes the exciting coil adjustment signal generation unit 1100 that outputs a direct current adjustment signal, adjusted in advance, which is superimposed with respect to the excitation signal, the excitation signal adjustment unit 1016 superimposes the direct current adjustment signal generated by the exciting coil adjustment signal generation unit 1100 to generate the excitation signal, and applies the generated signal to the exciting coil 52.

Step S37:

The data signal conversion unit 1015 amplifies voltage information which is supplied by the feedback signal adjustment unit 1013 on the basis of a amplification degree which is set in advance, and outputs the amplification result as a data signal to the data signal determination unit 104.

Step S38:

The data signal determination unit 104 determines whether the voltage value of the data signal is included in a data range which is set in advance.

In this case, when the voltage value indicating the data signal is included in the data range, the process of the data signal determination unit 104 proceeds to step S39. On the other hand, when the voltage value indicated by the data signal is not included in the data range, the process proceeds to step S40.

Step S39:

Since the data signal is included in the data range, the data signal determination unit 104 outputs the data signal, as it is, to a magnetic field intensity detection device which are disposed outside.

The external magnetic field intensity detection device reads out a magnetic field intensity corresponding to a voltage value indicated by the supplied data signal, from the magnetic field intensity table which is stored in the internal storage unit, and causes a display unit of the external magnetic field intensity detection device to display the read-out magnetic field intensity.

Step S40:

On the other hand, since the data signal is not included in the data range, the data signal determination unit 104 discards the data signal, and outputs an error signal to the magnetic field intensity detection device which is disposed outside.

In this case, for example, when the error signal is supplied, the magnetic field intensity detection device causes the display unit of the magnetic field intensity detection device to display information for notifying a user of exceeding a measurement range.

When a power source is supplied, the magnetic element control device 110 performs the processes of step S31 to step S40 in accordance with the flow diagram shown in FIG. 11 mentioned above. In addition, when a power source is applied to the magnetic element control device 110, the feedback signal adjustment unit 1013 resets data having integrated voltage information present in the internal storage unit, and writes 0 as an initial value.

In the present embodiment, the exciting coil adjustment signal generation unit 1100 or the feedback coil adjustment signal generation unit 1200 that outputs a direct current adjustment signal, adjusted in advance, which is superimposed with respect to the excitation signal or the feedback signal is included. The excitation signal adjustment unit 1016 or the feedback signal adjustment unit 1013 generates the excitation signal or the feedback signal on the basis of the direct current adjustment signals, and applies the generated signal to the exciting coil 52 or the feedback coil 53. For this reason, since the detection signal which is detected by the detection signal comparison unit 1012 can be generated so as to be deviated with respect to a region (non-linear region) in which the crossover distortion of the excitation signal is generated, it is possible to measure a stationary magnetic field while maintaining linearity from the measurement lower limit to the measurement upper limit.

Therefore, in the magnetic element control device that detects a magnetic field of a magnetic balance system using a time-resolution FG-type magnetic element, it is possible to improve the output stability of the device without being influenced by signal distortion which is generated in the excitation signal.

In addition, programs for realizing each function (arithmetic operation processing of generating a feedback signal based on a digital value) of the magnetic element control unit 111 shown in FIG. 1, the magnetic element control unit 121 shown in FIG. 4, and the magnetic element control unit 131, 141, 151, and 161 shown in FIGS. 6 to 9 are recorded in a computer readable recording medium, and thus processing of magnetic element control may be performed by causing a computer system to read and execute the programs recorded in this recording medium. Meanwhile, the term "computer system" as used herein includes an OS or hardware such as peripheral devices.

In addition, the "computer system" also includes a homepage providing environment (or a display environment) when a WWW system is use.

In addition, the term "computer readable recording medium" refers to a flexible disk, a magneto-optic disc, a ROM, a portable medium such as a CD-ROM, and a storage device such as a hard disk built in the computer system. Further, the "computer readable recording medium" includes recording mediums that dynamically hold a program during a short period of time like networks such as the Internet or communication lines when a program is transmitted through communication lines such as a telephone line, and recording mediums that hold a program for a certain period of time like a volatile memory inside a computer system serving as a server or a client in that case. In addition the above-mentioned program may be a program which is used for realizing a portion of the aforementioned functions, and is capable of realizing the aforementioned functions by a combination of programs previously recorded in the computer system.

As stated above, the embodiments of the present invention have been described in detail with the accompanying drawings, but specific configurations are not limited to the above embodiments, and also include a design and the like without departing from the scope of the present invention.

What is claimed is:

1. A magnetic element control device that controls a fluxgate type magnetic element comprising an exciting coil, a detection coil, and a feedback coil when an intensity of a stationary magnetic field which is applied to the magnetic element is detected using a time-resolution magnetic balance system, the device comprising:
    an excitation signal generation unit that generates an alternating signal;
    an excitation signal adjustment unit that generates an alternating voltage signal from the alternating signal, and generates an excitation signal which is applied to the exciting coil on the basis of the alternating voltage signal;
    a detection signal comparison unit that detects a detection signal of a positive voltage or a negative voltage which is generated by an induced electromotive force when a current direction of the excitation signal switches;
    a feedback signal generation unit that converts a time width between detection signals of the positive voltage and the negative voltage into voltage information;
    a feedback signal adjustment unit that generates a feedback signal that applies a magnetic field, cancelling out the stationary magnetic field which is applied to the magnetic element from the voltage information, to the feedback coil;
    a data signal conversion unit that outputs the feedback signal as a data signal indicating a magnetic field intensity; and
    an adjustment signal generation unit that outputs a direct current adjustment signal, adjusted in advance, which is superimposed with respect to at least one of the excitation signal or the feedback signal,
    wherein the excitation signal adjustment unit or the feedback signal adjustment unit generates the excitation signal or the feedback signal on the basis of the direct current adjustment signal to apply the generated signal to the exciting coil or the feedback coil, and generates the detection signal detected by the detection signal comparison unit so as to be deviated with respect to a non-linear region of the excitation signal,
    wherein the adjustment signal generation unit comprises a first resistor of which one end is connected to an input terminal capable of inputting an adjustment voltage,
    the excitation signal adjustment unit or the feedback signal adjustment unit comprises
    a second resistor of which one end is connected to the excitation signal generation unit and the feedback signal generation unit, and
    a difference amplifier in which the first resistor and the second resistor are connected to an inverting input terminal, and a non-inverting input terminal is connected to a reference voltage which is set in advance,
    the exciting coil or the feedback coil is connected between an output terminal and the inverting input terminal of the difference amplifier, and
    the difference amplifier is configured to cause a current to flow to the exciting coil or the feedback coil so that a voltage level of the inverting input terminal and a voltage level of the non-inverting input terminal are equal to each other.

2. The magnetic element control device according to claim 1, further comprising a temperature sensor that measures a temperature of the magnetic element,
    wherein the adjustment signal generation unit performs correction by multiplying the direct current adjustment signal by a coefficient corresponding to the temperature, and supplies the direct current adjustment signal after the correction to the excitation signal adjustment unit or the feedback signal adjustment unit.

3. The magnetic element control device according to claim 1, wherein the feedback signal generation unit obtains a duty ratio indicating a voltage value of the feedback signal, as the voltage information, from the time width, and outputs a square wave of the duty ratio indicating the voltage value of the feedback signal to the feedback signal adjustment unit, and
    the feedback signal adjustment unit generates the feedback signal which is a direct-current voltage obtained by associating the square wave with the duty ratio.

4. The magnetic element control device according to claim 1, wherein the feedback signal generation unit obtains a difference between the time width and a reference time width which is set in advance, obtains a digital value indicating the voltage value of the feedback signal, as the voltage information, from the difference, and outputs the digital value to the feedback signal adjustment unit, and
    the feedback signal adjustment unit generates a feedback signal which is a direct-current voltage indicated by the digital value.

5. The magnetic element control device according to claim 1, further comprising:

a clock signal generation unit that generates a periodic clock signal, an excitation signal generation unit that generates a triangular wave signal as the alternating signal synchronized with the clock signal.

6. A magnetic element control method of controlling a flux-gate type magnetic element having an exciting coil, a detection coil, and a feedback coil when an intensity of a stationary magnetic field which is applied to the magnetic element is detected using a time-resolution magnetic balance system, the method comprising:

an excitation signal generation process that an excitation signal generation unit generates an alternating signal;

an excitation signal adjustment process that an excitation signal adjustment unit generates an alternating voltage signal from the alternating signal, and generating an excitation signal which is applied to the exciting coil on the basis of the alternating voltage signal;

a detection signal comparison process that a detection signal comparison unit detects a detection signal of a positive voltage or a negative voltage which is generated by an induced electromotive force when a current direction of the excitation signal switches;

a feedback signal generation process that a feedback signal generation unit converts a time width between detection signals of the positive voltage and the negative voltage into voltage information;

a feedback signal adjustment process that a feedback signal adjustment unit generates a feedback signal which applies a magnetic field, a data signal conversion process that a data signal conversion unit outputs the feedback signal as a data signal indicating a magnetic field intensity; and an adjustment signal generation process that an adjustment signal generation unit outputs a direct current adjustment signal, adjusted in advance, which is superimposed with respect to at least one of the excitation signal or the feedback signal, wherein the excitation signal adjustment process or the feedback signal adjustment process includes a process of generates the excitation signal or the feedback signal on the basis of the direct current adjustment signal to apply the generated signal to the exciting coil or the feedback coil, and generating the detection signal detected in the detection signal comparison process so as to be deviated with respect to a non-linear region of the excitation signal, wherein the adjustment signal generation unit comprises a first resistor of which one end is connected to an input terminal capable of inputting an adjustment voltage, the excitation signal adjustment unit or the feedback signal adjustment unit includes a second resistor of which one end is connected to the excitation signal generation unit and the feedback signal generation unit, and a difference amplifier in which the first resistor and the second resistor are connected to an inverting input terminal, and a non-inverting input terminal is connected to a reference voltage which is set in advance, the exciting coil or the feedback coil is connected between an output terminal and the inverting input terminal of the difference amplifier, and the difference amplifier is configured to cause a current to flow to the exciting coil or the feedback coil so that a voltage level of the inverting input terminal and a voltage level of the non-inverting input terminal are equal to each other.

7. A magnetic detection device which is based on a magnetic balance system that detects an intensity of a stationary magnetic field to be applied, the device comprising:

a flux-gate type magnetic element having an exciting coil, a detection coil, and a feedback coil;

an excitation signal generation unit that generates an alternating signal;

an excitation signal adjustment unit that generates an alternating voltage signal from the alternating signal, and generates an excitation signal which is applied to the exciting coil on the basis of the alternating voltage signal;

a detection signal comparison unit that detects a detection signal of a positive voltage or a negative voltage which is generated by an induced electromotive force when a current direction of the excitation signal switches;

a feedback signal generation unit that converts a time width between detection signals of the positive voltage and the negative voltage into voltage information;

a feedback signal adjustment unit that generates a feedback signal that applies a magnetic field, cancelling out the stationary magnetic field which is applied to the magnetic element from the voltage information, to the feedback coil;

a data signal conversion unit that outputs the feedback signal as a data signal indicating a magnetic field intensity; and an adjustment signal generation unit that outputs a direct current adjustment signal, adjusted in advance, which is superimposed with respect to at least one of the excitation signal or the feedback signal, wherein the excitation signal adjustment unit or the feedback signal adjustment unit generates the excitation signal or the feedback signal on the basis of the direct current adjustment signal to apply the generated signal to the exciting coil or the feedback coil, and generates the detection signal detected by the detection signal comparison unit so as to be deviated with respect to a non-linear region in the current direction of the excitation signal, wherein the adjustment signal generation unit comprises a first resistor of which one end is connected to an input terminal capable of inputting an adjustment voltage, the excitation signal adjustment unit or the feedback signal adjustment unit comprises a second resistor of which one end is connected to the excitation signal generation unit and the feedback signal generation unit, and a difference amplifier in which the first resistor and the second resistor are connected to an inverting input terminal, and a non-inverting input terminal is connected to a reference voltage which is set in advance, the exciting coil or the feedback coil is connected between an output terminal and the inverting input terminal of the difference amplifier, and the difference amplifier is configured to cause a current to flow to the exciting coil or the feedback coil so that a voltage level of the inverting input terminal and a voltage level of the non-inverting input terminal are equal to each other.

\* \* \* \* \*